United States Patent
Yuan et al.

(10) Patent No.: US 9,236,131 B1
(45) Date of Patent: Jan. 12, 2016

(54) BIAS TO DETECT AND PREVENT SHORT CIRCUITS IN THREE-DIMENSIONAL MEMORY DEVICE

(71) Applicant: SanDisk Technologies Inc., Plano, TX (US)

(72) Inventors: Jiahui Yuan, Fremont, CA (US); Jayavel Pachamuthu, San Jose, CA (US); Yingda Dong, San Jose, CA (US); Wei Zhao, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/451,223

(22) Filed: Aug. 4, 2014

(51) Int. Cl.
*G11C 16/04* (2006.01)
*G11C 16/10* (2006.01)
*G11C 16/26* (2006.01)
*H01L 21/822* (2006.01)

(52) U.S. Cl.
CPC ............... *G11C 16/10* (2013.01); *G11C 16/26* (2013.01); *G11C 2213/71* (2013.01); *H01L 21/8221* (2013.01)

(58) Field of Classification Search
CPC ............ H01L 21/8221; H01L 25/0657; H01L 27/11551; H01L 27/11578; G11C 2213/71; G11C 16/0483; G11C 16/10; G11C 5/025; G11C 5/06
USPC ............... 365/185.18, 185.17, 185.11, 51, 63
See application file for complete search history.

(56) References Cited

U.S. PATENT DOCUMENTS

| | | | |
|---|---|---|---|
| 6,307,778 B1 | 10/2001 | Micheloni et al. | |
| 6,437,576 B2 | 8/2002 | Lorito | |
| 7,826,268 B2 | 11/2010 | Fujita et al. | |
| 8,199,573 B2 | 6/2012 | Fukuzumi et al. | |
| 8,309,405 B2 | 11/2012 | Yang et al. | |
| 8,345,479 B2 | 1/2013 | Maejima | |
| 8,482,049 B2 | 7/2013 | Son et al. | |
| 8,488,378 B2 | 7/2013 | Maeda | |
| 8,693,254 B2 | 4/2014 | Hashimoto | |
| 8,917,557 B2 * | 12/2014 | Sakaguchi et al. | 365/185.25 |
| 2006/0203599 A1 | 9/2006 | Doyle et al. | |
| 2009/0268523 A1 | 10/2009 | Maejima | |
| 2010/0259961 A1 | 10/2010 | Fasoli et al. | |
| 2012/0008410 A1 | 1/2012 | Huynh et al. | |

(Continued)

OTHER PUBLICATIONS

U.S. Appl. No. 14/451,210, filed Aug. 4, 2014.

(Continued)

*Primary Examiner* — David Lam
(74) *Attorney, Agent, or Firm* — Vierra Magen Marcus LLP

(57) ABSTRACT

In a three-dimensional stacked non-volatile memory device, a short circuit in a select gate layer is detected and prevented. A short circuit may occur when charges which are accumulated in select gate lines due to plasma etching, discharge through a remaining portion of the select gate layer in a short circuit path when the select gate lines are driven. To detect a short circuit, during a testing phase, an increasing bias is applied is applied to the remaining portion while a current is measured. An increase in the current above a threshold indicates that the bias has exceed a breakdown voltage of a short circuit path. A value of the bias at this time is recorded as an optimal bias. During subsequent operations involving select gate transistors or memory cells, such as programming, erasing or reading, the optimal bias is applied when the select gate lines are driven to prevent a current flow through the short circuit.

20 Claims, 22 Drawing Sheets

(56) References Cited

U.S. PATENT DOCUMENTS

| | | |
|---|---|---|
| 2013/0032875 A1 | 2/2013 | Yun et al. |
| 2013/0163337 A1 | 6/2013 | Li et al. |
| 2013/0234338 A1 | 9/2013 | Uenaka et al. |

OTHER PUBLICATIONS

Restriction Requirement dated Jun. 17, 2015, U.S. Appl. No. 14/451,210, filed Aug. 4, 2014.

Response to Restriction Requirement dated Aug. 20, 2015, U.S. Appl. No. 14/451,210, filed Aug. 4, 2014.

Supplementary Amendment dated Oct. 9, 2015, U.S. Appl. No. 14/451,210, filed Aug. 4, 2014.

Invitation to pay Additional Fees dated Oct. 20, 2015, International Application No. PCT/US2015/042302.

International Search Report & The Written Opinion of the International Searching Authority dated Oct. 16, 2015, International Application No. PCT/US2015/042305.

\* cited by examiner

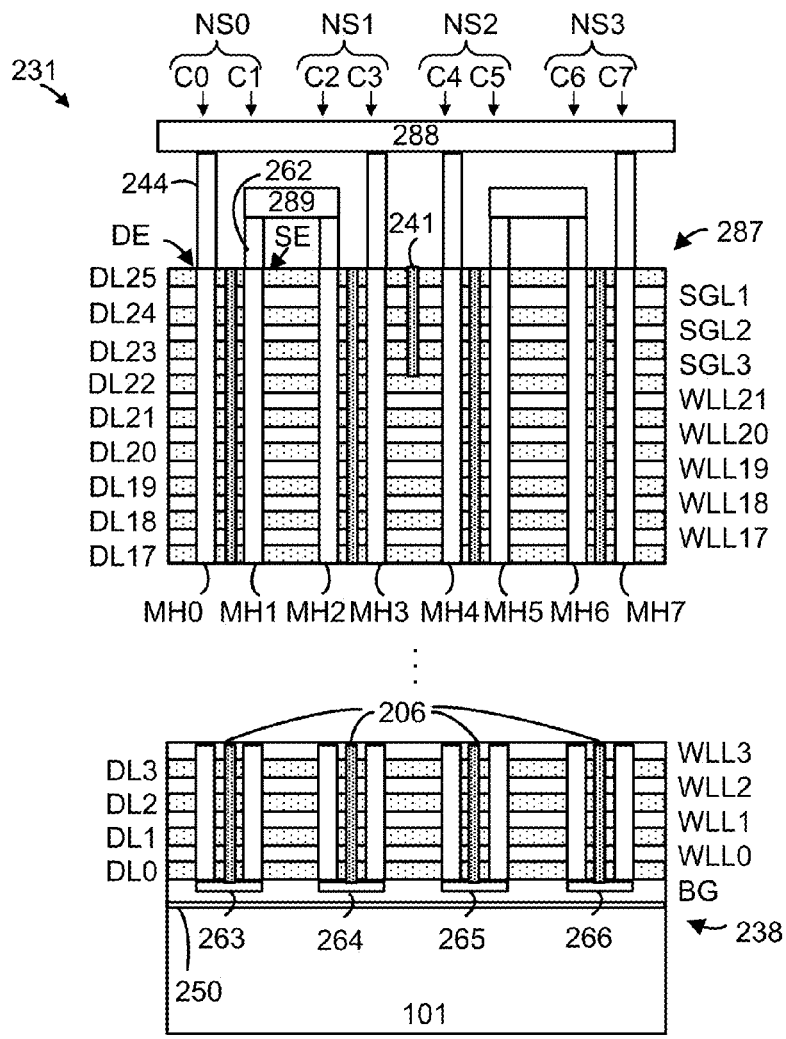
Fig. 2C1
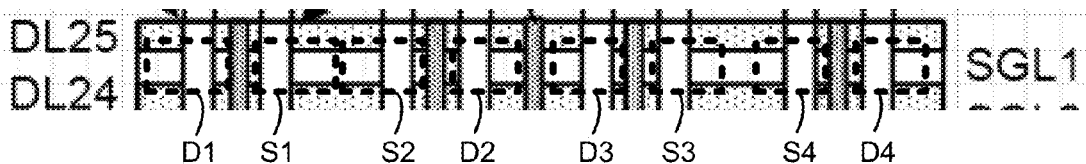
Fig. 2C2

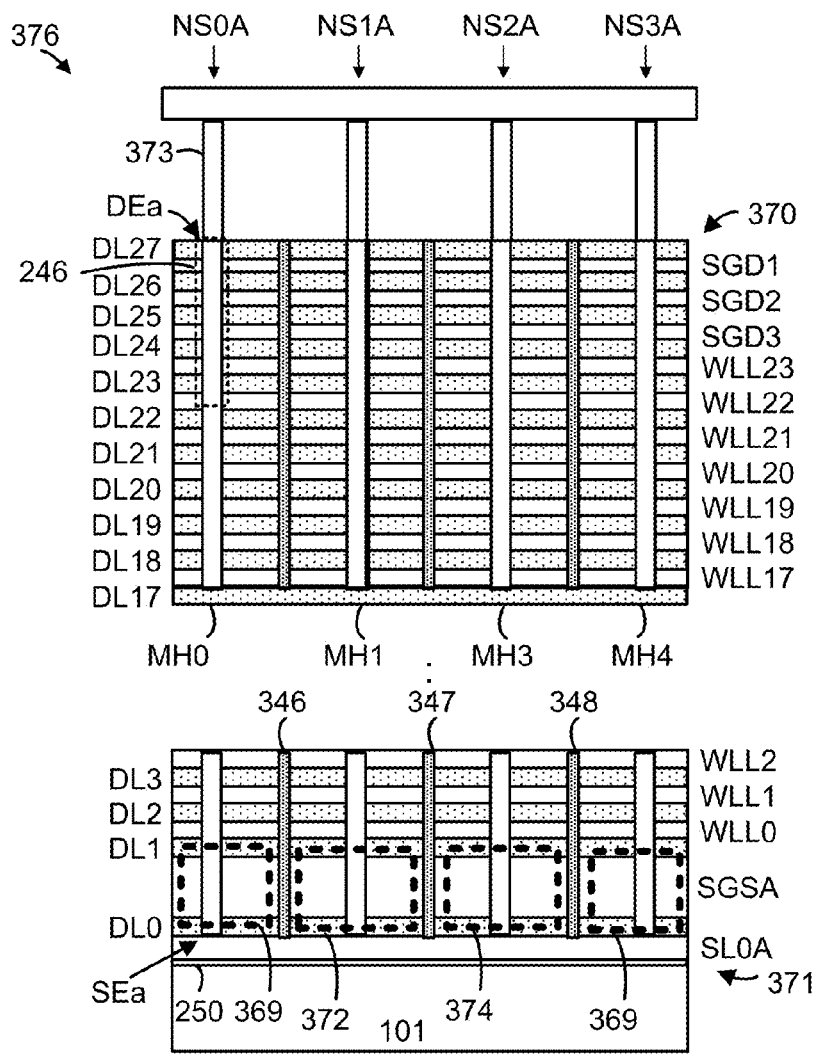
Fig. 3C1
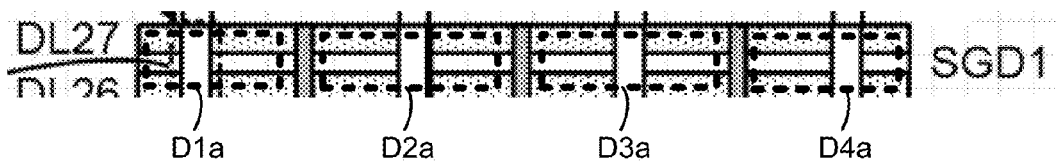
Fig. 3C2

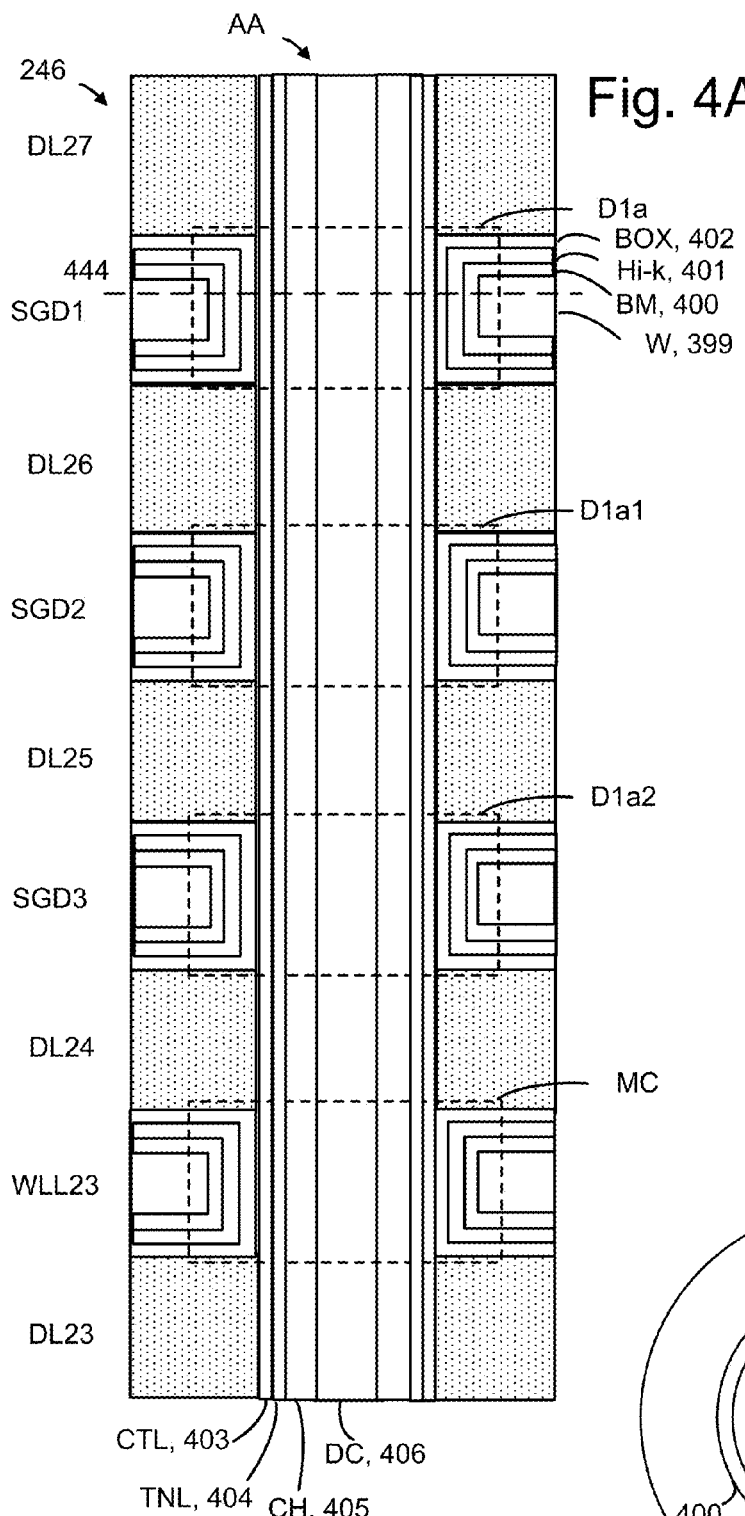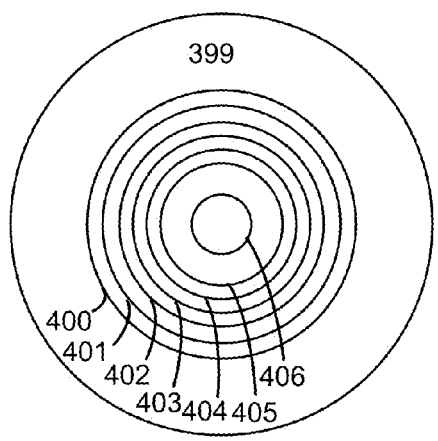

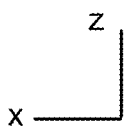
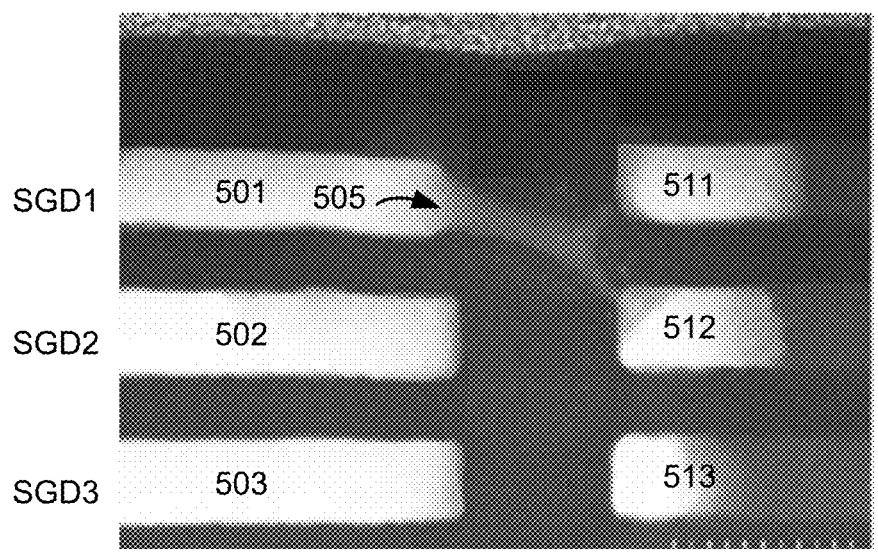

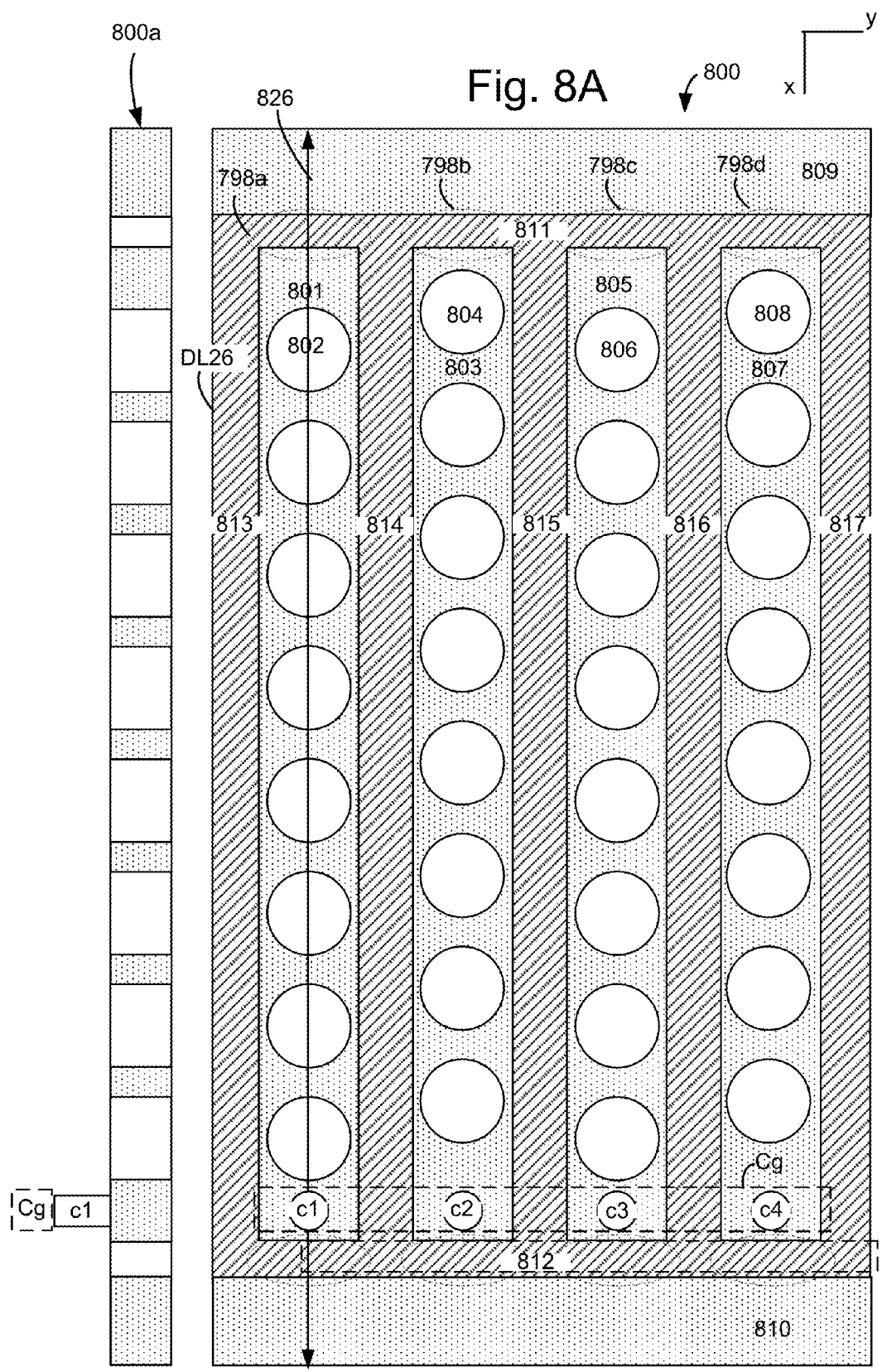

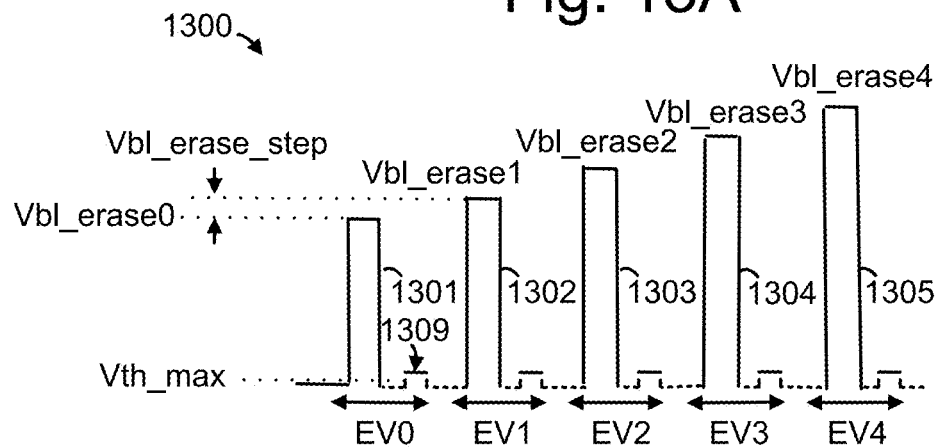
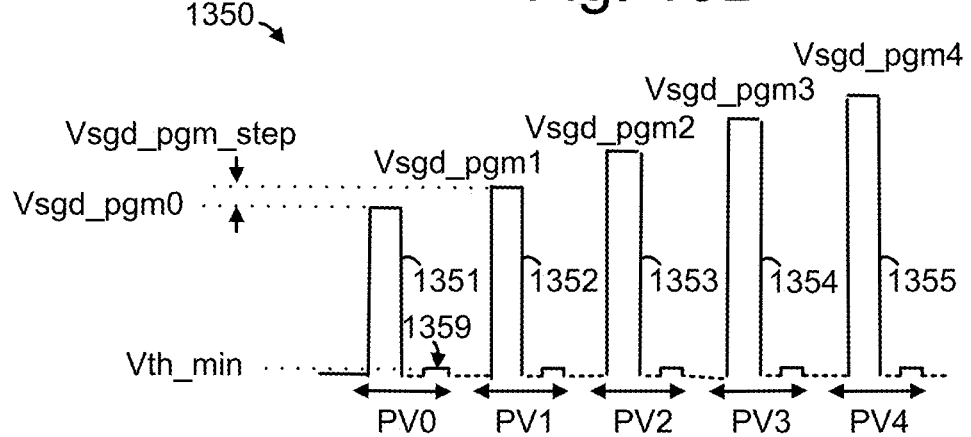

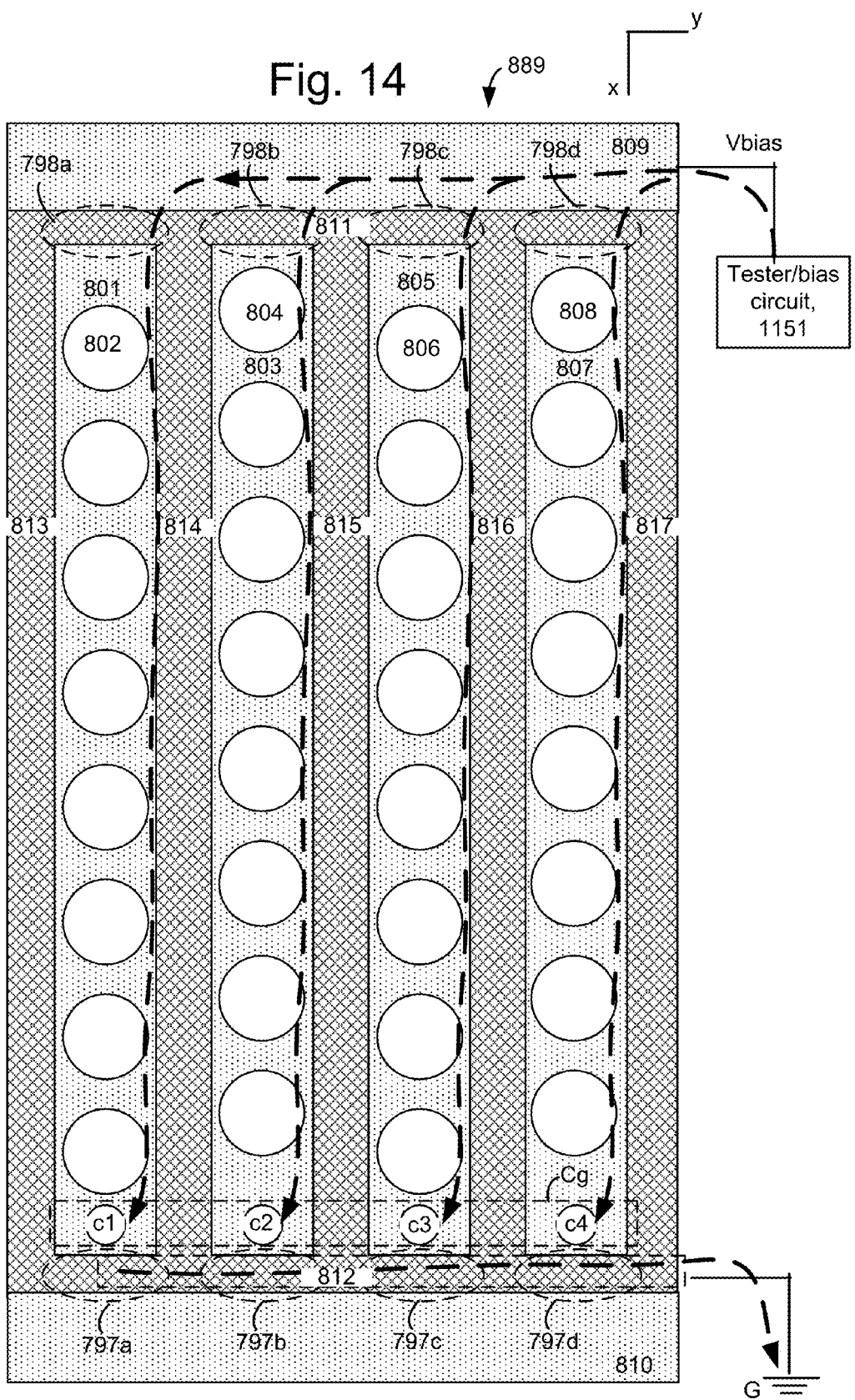

BIAS TO DETECT AND PREVENT SHORT CIRCUITS IN THREE-DIMENSIONAL MEMORY DEVICE

BACKGROUND

The present technology relates to a three-dimensional (3D) non-volatile memory device.

Recently, ultra high density storage devices have been proposed using a 3D stacked memory structure sometimes referred to as a Bit Cost Scalable (BiCS) architecture. For example, a 3D NAND stacked memory device can be formed from a stack of alternating conductive and dielectric layers. A memory hole is formed in the stack, and the hole is filled with appropriate materials to form a NAND string. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells and select gate transistors are provided by the conductive layers. However, various challenges are presented in fabricating and operating such memory devices.

BRIEF DESCRIPTION OF THE DRAWINGS

Like-numbered elements refer to common components in the different figures.

FIG. 2C1 depicts an embodiment of a stack 231 showing a cross-sectional view of the portion 209 of FIG. 2A, along line 220, where three select gate layers, SGL1, SGL2 and SGL3 are provided.

FIG. 2C2 depicts a close up view of the SGL1 layer of FIG. 2C1, showing regions D1, D2, D3 and D4 which represent SGD transistors and regions S1, S2, S3 and S4 which represent SGS transistors.

FIG. 3C1 depicts an embodiment of a stack 376 showing a cross-sectional view of the portion 307 of FIG. 3A, along line 305, where three SGD layers are provided.

FIG. 3C2 depicts a close up view of the SGD1 layer of FIG. 3C1, showing regions D1a, D2a, D3a and D4a which represent SGD transistors.

FIG. 4A depicts a view of the region 246 of FIG. 3C1, showing SGD transistors D1a (consistent with FIG. 3C2), D1a1 and D1a2 above a memory cell (MC).

FIG. 4B depicts a cross-section view of the region 246 of FIG. 4A along line 444.

FIG. 5 depicts an image showing a short circuit path between a conductive line 501 in a topmost SGD layer (SGD1) and remaining portions 511 and 512 of SGD1 and SGD2, respectively.

FIG. 8A depicts a top view of a select gate layer 800, including parallel select gate lines 801, 803, 805 and 807, remaining portions 809 and 810, end trenches 811 and 812 and side trenches 813, 814, 815, 816 and 817.

FIG. 13A depicts an example waveform during erasing of SGD transistors, consistent with step 646 of FIG. 6E.

FIG. 13B depicts an example waveform during programming of SGD transistors, consistent with step 647 of FIG. 6E.

FIG. 14 depicts a view of a select gate layer 889 after depositing oxide in side trenches in the select gate layer of FIG. 8A and while using a tester/bias circuit 1151 to test for short circuits.

DETAILED DESCRIPTION

A 3D memory device is provided in which a select gate layer includes a protective device which prevents a short circuit between select gate lines and a remaining portion of the select gate layer. In another aspect, techniques are provided for using a bias to detect and prevent a short circuit in a 3D memory device.

In a 3D memory device, a stack of alternating conductive and dielectric layers are formed. Memory holes are etched in the stack and films are deposited in the holes such that memory cells or select gate transistors are formed where the conductive layers intersect with the memory holes. Some of the conductive layers are used as control gates for memory cells and other conductive layers are used as control gates for select gate transistors, such as drain or source side transistors in NAND strings. However, in forming the control gates, the stack is subject to plasma etching processes in which charges can accumulate in a top conductive layer, in particular. These charges can diffuse out of the conductive material and into an adjacent oxide, causing a short circuit path. For example, the top conductive layer may be etched to form lines of conductive material which are separated from a remaining portion of the conductive material. A short circuit path may be formed between one or more of the lines of conductive material and the remaining portion.

In one aspect, a memory device as provided herein addresses the above-mentioned issue by providing a protective material between the lines of conductive material and the remaining portion. For example, the protective material can comprises layers of material at ends of the lines of conductive material. The protective material can provide a device such as a diode, capacitor, resistor (e.g., a linear resistor having a fixed resistance) or varistor (e.g., a nonlinear resistor having a resistance which varies with voltage). Further, the protective material can have a higher breakdown voltage than the oxide which extends along sides of the lines of conductive material. A corresponding fabrication process for such a memory device is also provided. In a further aspect, a testing device determines a current flow through any short circuits and determines an optimal bias voltage to apply to the remaining portion during subsequent program, erase and read operations in the memory device to counteract any short circuit. The protective material may not be used in this approach.

The following discussion provides details of the construction of a memory device and of related techniques which address the above and other issues.

Figure 1A:
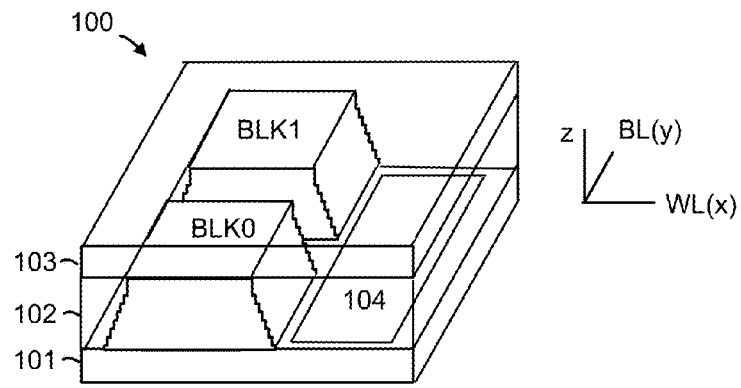
FIG. 1A is a perspective view of a 3D stacked non-volatile memory device.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
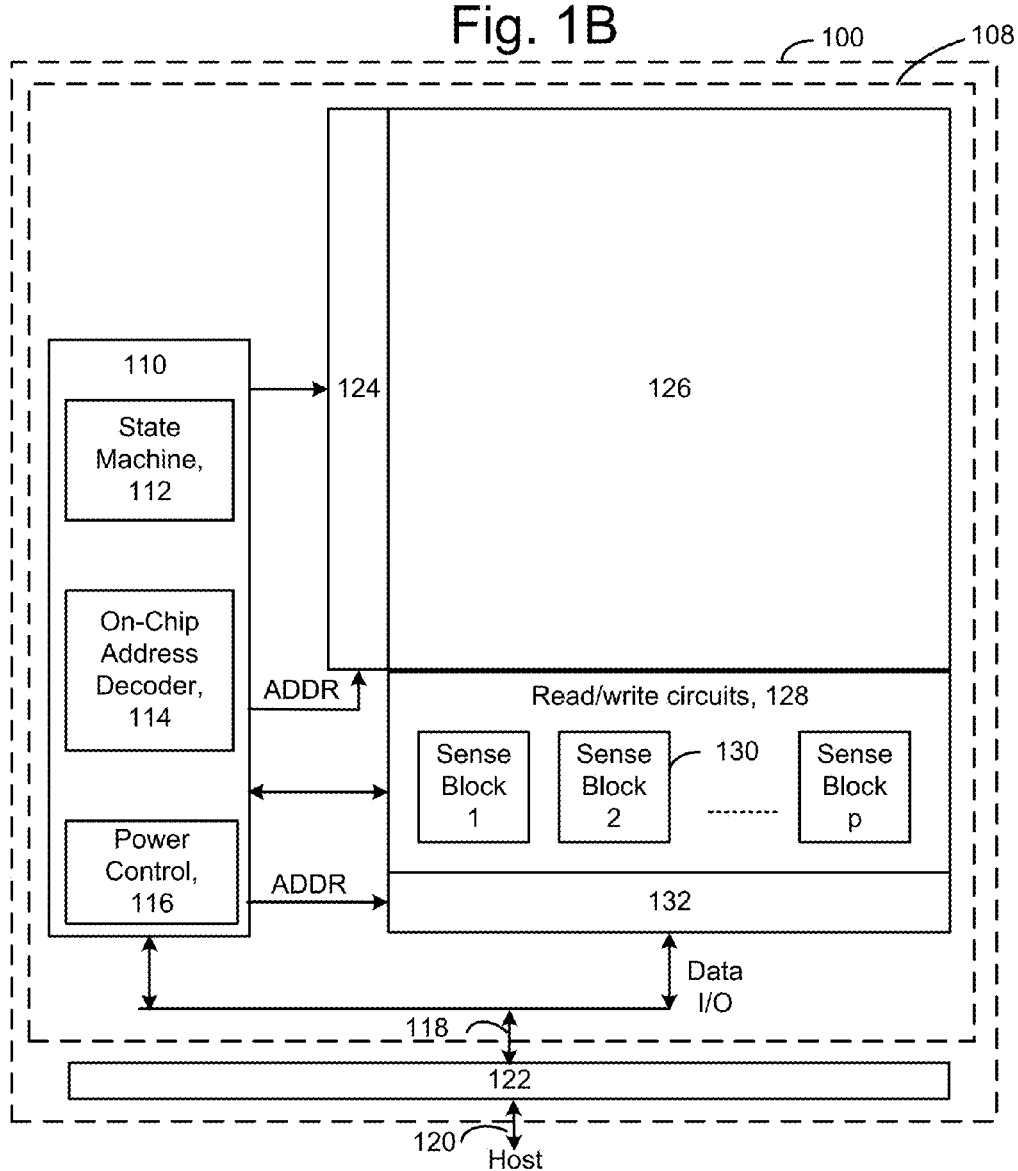
FIG. 1B is a functional block diagram of a memory device such as the 3D stacked non-volatile memory device 100 of FIG. 1A.

FIG. 1B is a functional block diagram of a memory device such as the 3D stacked non-volatile memory device 100 of FIG. 1A. The memory device 100 may include one or more memory die 108. The memory die 108 includes a memory array 126 of memory cells, control circuitry 110, and read/write circuits 128. In a 3D configuration, the memory array can include the blocks BLK0 and BLK1 of FIG. 1A. The memory array 126 is addressable by word lines via a row decoder 124 and by bit lines via a column decoder 132. The read/write circuits 128 include multiple sense blocks 130 (sensing circuitry) and allow a page of memory cells to be read or programmed in parallel. Typically a controller 122 is included in the same memory device 100 (e.g., a removable storage card) as the one or more memory die 108. Commands and data are transferred between the host and controller 122 via lines 120 and between the controller and the one or more memory die 108 via lines 118.

The memory structure may comprise one or more array of memory cells including a 3D array. The memory structure may comprise a monolithic three dimensional memory array in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory array 126, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD transistors and source lines. The sense blocks 130 can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory array 126, can be thought of as at least one control circuit. For example, a control circuit may include any one of, or a combination of, control circuitry 110, state machine 112, decoders 114/132, power control module 116, sense blocks 130, read/write circuits 128, and controller 122, and so forth.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figures 2A, 2B:
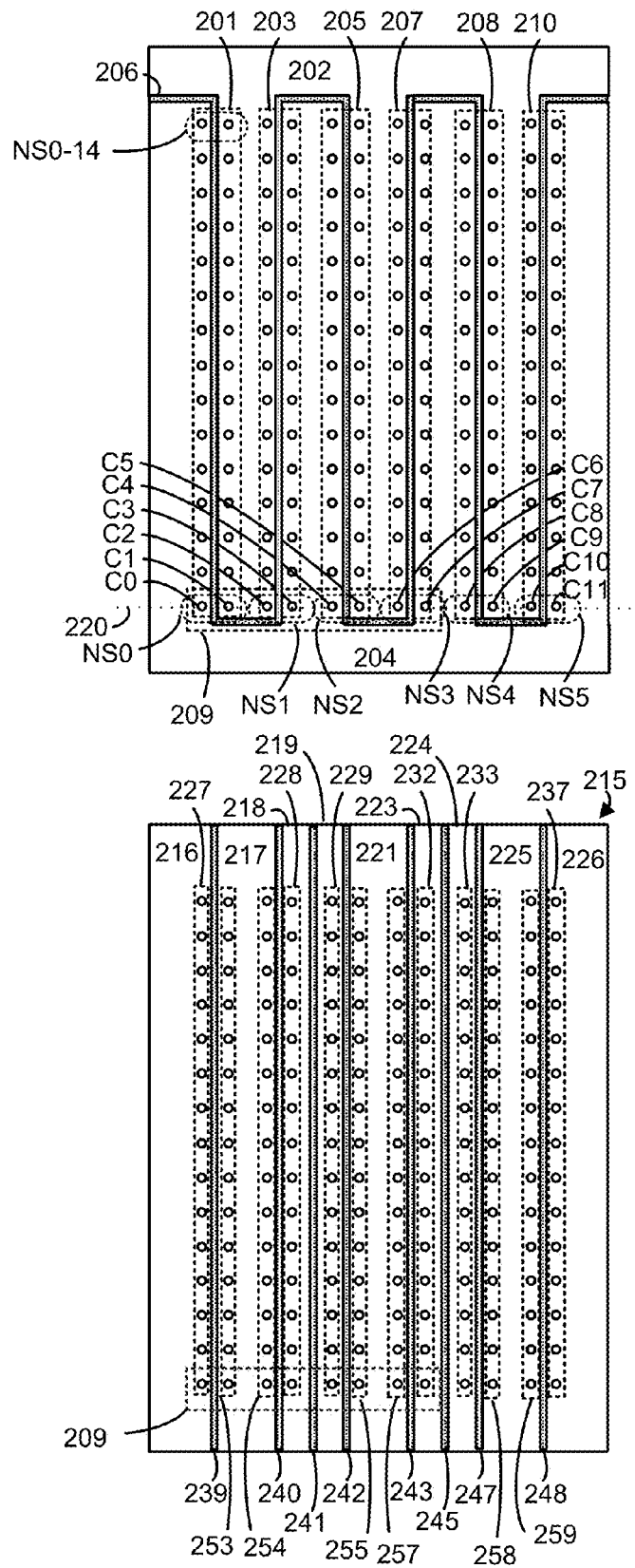
FIG. 2A depicts a top view of example word line layers 202 and 204 in a U-shaped NAND embodiment, as an example implementation of BLK0 in FIG. 1A.
FIG. 2B depicts a top view of example select gate layer portions, consistent with FIG. 2A.

FIG. 2A depicts a top view of example word line layers 202 and 204 in a U-shaped NAND embodiment, as an example implementation of BLK0 in FIG. 1A. In a 3D stacked memory device, memory cells are formed along memory holes which extend through alternating conductive and dielectric layers in a stack. The memory cells are typically arranged in NAND strings. Each conductive layer can include one or more word line layers.

The view is of a representative layer among the multiple WLLs in a stack. Referring also to FIG. 2C1, the stack includes alternating dielectric and conductive layers. The dielectric layers include DL0 to DL25 and may be made of SiO2, for instance. The conductive layers include a back gate layer (BGL), word line layers WLL0 to WLL23 and select gate layers SGL1, SGL2 and SGL3. The word line layers are conductive paths to control gates of the memory cells at the layer. Moreover, each select gate layer may comprises conductive lines to select gate transistors (e.g., SGD and/or SGS transistors).

The word line layers of FIG. 2A may represent any one of the word line layers in FIG. 2C1. These conductive layers may include doped polysilicon, metal such as tungsten or metal silicide, for instance. An example voltage of 5-10 V may be applied to the back gate to maintain a conductive state which connects the drain- and source-side columns.

For each block, each conductive layer may be divided into two word line layers 202 and 204 which are insulated from one another by a slit 206. The slit is formed by etching a void which extends vertically in the stack, typically from an etch stop layer at the bottom to at least a top layer of the stack, then filling the slit with insulation. This is an example of the type of etching which can result in the accumulation of charges in the top conductive layer of the stack. The slit 206 is a single continuous slit which extends in a zig-zag pattern in the block. This approach can provide greater flexibility in controlling the memory cells since the WLLs can be driven independently.

Each block includes memory holes or pillars which extend vertically in the stack, and comprise a column of memory cells such as in a NAND string. Each circle represents a memory hole or a memory cell associated with the word line layer. Example columns of memory cells along a line 220 include C0 to C11. Columns C0, C3, C4, C7, C8 and C11 represent the drain side columns of respective NAND strings. Columns C1, C2, C5, C6, C9 and C10 represent the source side columns of respective NAND strings. The figure represents a simplification, as many more rows of memory holes will typically be used, extending to the right and left in the figure. Also, the figures are not necessarily to scale. The columns of memory cells can be arranged in subsets such as sub-blocks.

Further, the NAND strings are arranged in sets, where each NAND string in a set has an SGD transistor with a common control gate voltage. See also FIG. 2B. Regions 201, 203, 205, 207, 208 and 210 each represent a set of NAND strings, or a set of memory cells in a word line layer. For example, region 210 includes NAND strings NS0, . . . , NS0-14. A programming operation can involve one set of NAND strings. Each NAND string in a set can be associated with a respective bit line which is independently controlled to allow or inhibit programming.

The drawings are not to scale and do not show all memory columns. For example, a more realistic block might have 12 memory columns in the y direction as shown, but a very large number such as 32 k memory columns in the x direction, for a total of 384 k memory columns in a block. With U-shaped NAND strings, 192 k NAND strings are provided in this example. With straight NAND strings, 384 k NAND strings are provided in this example. Assuming there are twenty-four memory cells per column, there are 384 k×24=9,216 k memory cells in the set.

FIG. 2B depicts a top view of example select gate layer portions, consistent with FIG. 2A. In one approach, the select gate layer 215 is different than a WLL in that a separate SGD layer portion or line, is provided for each set of NAND strings. That is, each single row of SGD transistors extending in the x direction is separately controlled. In other words, the control gates of the SGD transistors in each set of NAND strings are commonly controlled.

Further, an SGS layer portion or line is provided for a pair of rows of SGS transistors extending in the x direction, in one approach, for adjacent sets of NAND strings. Optionally, additional slits are used so that a separate SGS layer portion is provided for a single row of SGS transistors extending in the x direction. Thus, the control gates of the SGS transistors in a pair of rows of SGS transistors, or in a single row of SGS transistors, are also commonly controlled.

The SGS and SGD layer portions are created due to slits 239, 240, 241, 242, 243, 245, 247 and 248. The slits extend partway down in the stack as depicted by example slit 241 in FIG. 2C1. Regions 227, 228, 229, 232, 233 and 237 represent SGD transistors in SGD layer portions 216, 218, 219, 223, 224 and 226, respectively. Regions 253 and 254, 255 and 257, and 258 and 259 represent SGS transistors in SGS layer portions 217, 221 and 225, respectively. Regions 255 and 257, 258 and 259, represent SGS transistors in SGS layer portions 221 and 225, respectively. The portion 209 from FIG. 2A is repeated for reference.

The select gate transistors are associated with NAND strings NS0-NS5.

FIG. 2C1 depicts an embodiment of a stack 231 showing a cross-sectional view of the portion 209 of FIG. 2A, along line 220, where three select gate layers, SGL1, SGL2 and SGL3 are provided. In this case, the slit extends down to DL22, so that three separate layers of select gate transistors are formed in each column of each NAND string. The stack as a top 287 and a bottom 238.

The conductive layers of the select gates can have a same height (channel length) as the conductive layers of the memory cells, in one approach. This facilitates the fabrication of the memory device. In a column, the individual select gate transistors together are equivalent to one select gate transistor having a channel length which is the sum of the channel lengths of the individual select gate transistors. Further, in one approach, as discussed further below, the lower select gate transistors in a column (e.g., in layers SGL2 and SGL3) are connected and received a common voltage during operations while the topmost select gate transistors in a column (e.g., in layer SGL1) can be operated using a separate voltage. The SGS transistors can have a similar construction as the SGD transistors.

The substrate may be p-type and can provide a ground which is connected to the top select gate layer, in one approach. A via 244 connects a drain side of C0 and NS0 to a bit line 288. A via 262 connects a source side of C1 and NS0 to a source line 289. Back gates 263, 264, 265 and 266 are provided in NS0, NS1, NS2 and NS3, respectively.

FIG. 2C2 depicts a close up view of the SGL1 layer of FIG. 2C1, showing regions D1, D2, D3 and D4 which represent SGD transistors and regions S1, S2, S3 and S4 which represent SGS transistors.

Figure 3A:
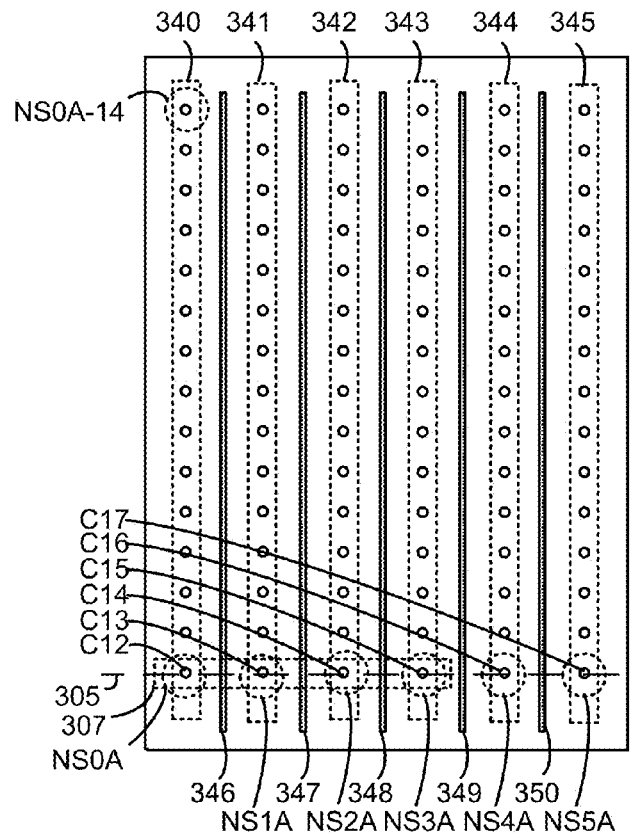
FIG. 3A depicts a top view of an example word line layer 304 of the block BLK0 of FIG. 1A, in a straight NAND string embodiment.

FIG. 3A depicts a top view of an example word line layer 304 of the block BLK0 of FIG. 1A, in a straight NAND string embodiment. In this configuration, a NAND string has only one column, and the source-side select gate is on the bottom of the column instead of on the top, as in a U-shaped NAND string. Moreover, a given level of a block has one WLL which is connected to each of the memory cells of the layer. Insulation-filled slits 346, 347, 348, 349 and 350 can also be used in the fabrication process to provide structural support for the stack when undoped polysilicon layers are removed by a wet etch and a dielectric is deposited to form the alternating dielectric layers. A dashed line 305 extends through columns C12-C17. A cross-sectional view along line 305 of portion 307 is shown in FIG. 3C1.

Regions 340, 341, 342, 343, 344 and 345 represent the memory cells (as circles) of respective sets of NAND strings. For example, region 340 represents memory cells in NAND strings NS0A, . . . , NS0A-14. Additional NAND strings include NS1A, NS2A, NS3A, NS4A and NS5A.

Alternatively, the layer 304 represents an SGS layer, in which case each circle represents an SGS transistor.

Figure 3B:
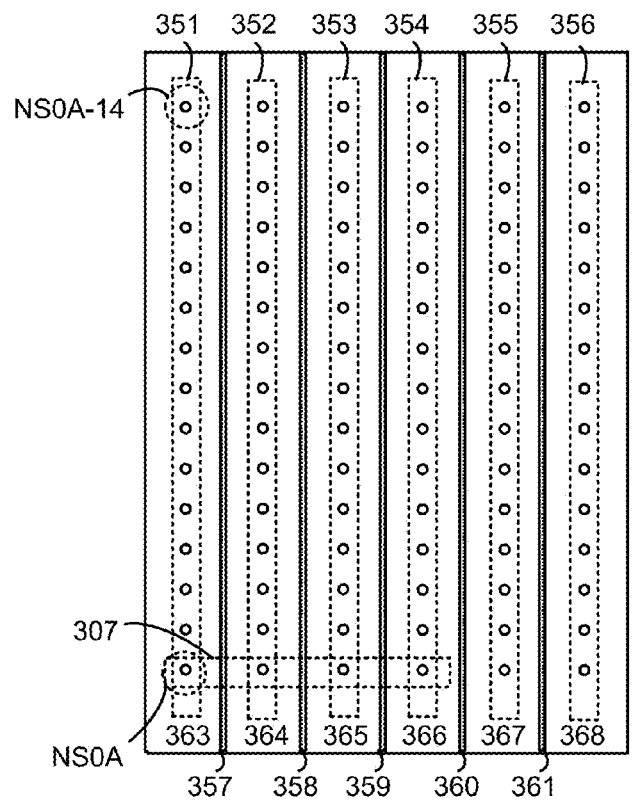
FIG. 3B depicts a top view of an example SGD layer 362, consistent with FIG. 3A.

FIG. 3B depicts a top view of an example SGD layer 362, consistent with FIG. 3A. Slits 357, 358, 359, 360 and 361 divide the SGD layer into portions 363, 364, 365, 366, 367 and 368. Each portion connects the SGD transistors in a set of NAND strings. For example, SGD layer portion 363 or line connects the SGD transistors in the set of NAND strings NS0A to NS0A-14. Regions 351, 352, 353, 354, 355 and 356 represent the SGD transistors (as circles) of respective sets of NAND strings in the SGD layer portions 363, 364, 365, 366, 367 and 368, respectively. The portion 307 from FIG. 3A is also repeated. The select gate transistors are associated with NAND strings NS0A-NS5A. The select gate lines may be subject to short circuits as discussed further below.

FIG. 3C1 depicts an embodiment of a stack 376 showing a cross-sectional view of the portion 307 of FIG. 3A, along line 305, where three SGD layers are provided. Columns of memory cells corresponding to NAND strings NS0A-NS3A are depicted in the multi-layer stack. The stack includes a substrate 101, an insulating film 250 on the substrate, and a portion of a source line SL0A. Additional straight NAND strings in a SGD line subset extend behind the NAND strings depicted in the cross-section, e.g., along the x-axis. NS0A has a source end SEa and a drain end DEa. The slits 346, 347 and 348 from FIG. 3A are also depicted. A portion of the bit line BL0A is also depicted. A conductive via 373 connects DEa to BL0A. The columns are formed in memory holes MH0-MH4. The memory holes are columnar and extend at least from a top 370 to a bottom 371 of the stack.

The source line SL0A is connected to the source ends of each NAND string. SL0A is also connected to other sets of memory strings which are behind these NAND strings in the x direction.

Word line layers, e.g., WLL0-WLL23, and dielectric layers, e.g., DL0-DL24, are arranged alternatingly in the stack. SGS transistors 369, 372, 374 and 375 are formed in the SG5A layer.

A region 246 of the stack is shown in greater detail in FIG. 4A.

FIG. 3C2 depicts a close up view of the SGD1 layer of FIG. 3C1, showing regions D1a, D2a, D3a and D4a which represent SGD transistors.

FIG. 4A depicts a view of the region 246 of FIG. 3C1, showing SGD transistors D1a (consistent with FIG. 3C2), D1a1 and D1a2 above a memory cell (MC). A number of layers can be deposited along the sidewalls of the column and within each word line layer. These layers can include oxide-nitride-oxide (O—N—O) and polysilicon layers which are deposited, e.g., using atomic layer deposition. For example, the column includes a charge-trapping layer or film (CTL) 403 such as SiN or other nitride, a tunnel oxide (TNL) 404, a polysilicon body or channel (CH) 405, and a core filler dielectric 406. A word line layer includes a block oxide (BOX) 402, a block high-k material 401, a barrier metal 400, and a conductive metal such as W 399. In another approach, all of these layers except the W are provided in the column. Additional memory cells are similarly formed throughout the columns. The layers in the memory hole form a columnar active area (AA) of the NAND string.

When a memory cell is programmed, electrons are stored in a portion of the CTL which is associated with the memory cell. These electrons are drawn into the CTL from the channel, and through the TNL. The Vth of a memory cell is increased in proportion to the amount of stored charge. During an erase operation, the electrons return to the channel.

Each of the memory holes can thus filled with a plurality of annular layers comprising a block oxide layer, a charge trapping layer, a tunneling layer and a channel layer. A core region of each of the memory holes is filled with a body material, and the plurality of annular layers are between the core region and the WLLs in each of the memory holes.

FIG. 4B depicts a cross-section view of the region 246 of FIG. 4A along line 444. Each layer is ring-shaped in one possible approach, except the core filler, which is a cylinder.

FIG. 5 depicts an image showing a short circuit path between a conductive line 501 in a topmost SGD layer (SGD1) and remaining portions 511 and 512 of SGD1 and SGD2, respectively. The image is part of a stack of alternating conductive and dielectric layers, where the conductive layers are white and the dielectric layers are dark. A vertical region of oxide is also dark. The conductive layer SGD1 comprises a conductive line 501 and a remaining portion 511. The conductive layer SGD2 comprises a conductive line 502 and a remaining portion 512. The conductive layer SGD3 comprises a conductive line 503 and a remaining portion 513. A region 505 of the oxide represents charges which form a short circuit path. The short circuit path occurs mainly with the topmost conductive layer.

As mentioned, short circuit paths can be formed due to the movement of charges which are trapped in a conductive material during plasma etching. The charges are ions which are discharged during a plasma process. One example of a plasma process is reactive-ion etching (RIE) in which plasma is generated under a vacuum by an electromagnetic field, and high-energy ions from the plasma attack the semiconductor material and react with it. Plasma processes can include both front end and back end fabrication processes for a memory device. The top conductive layer in a stack is generally most likely to trap charges in side surfaces of etched structures as the conductive layer is etched away. The top conductive layer can comprise doped polysilicon or metal such as tungsten, for instance. As the top conductive layer is etched to form conductive lines, for instance, the conductive lines act as antennas which attract charges (electrons and ions). As the charges are trapped, the electric potential of the conductive lines increases.

Subsequently, when an oxide such as SiO is deposited between the conductive lines, the charges begin to discharge into the oxide, forming conductive paths in the oxide. These paths are weakly conductive paths which can cause a short circuit between the conductive lines and the nearest ground, which is typically a remaining portion of the conductive layer which is left over after etching the conductive lines. When the fabrication of the memory device is completed, operations are performed which involve driving a voltage on the conductive lines. The voltage will seek to discharge from a conductive line through any conductive path in the oxide to the remaining portion of the conductive layer. As a result, the select gate transistors cannot be properly controlled. For example, a select gate transistor may remain in a non-conductive state, preventing programming or sensing of memory cells in the NAND strings.

Figure 6A:
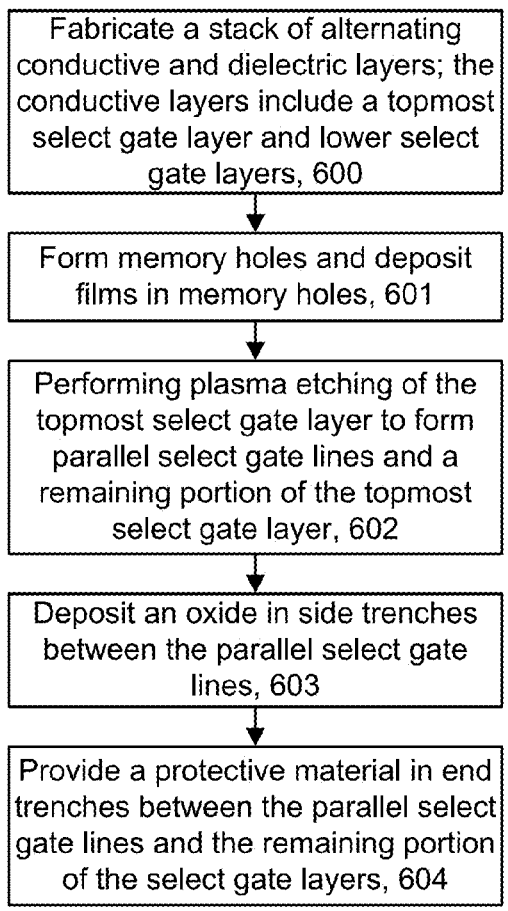
FIG. 6A depicts a process for fabricating a memory device in which a protective material protects against short circuits in a select gate layer.

FIG. 6A depicts a process for fabricating a memory device in which a protective material protects against short circuits in a select gate layer. Step 600 includes fabricating a stack of alternating conductive and dielectric layers, where the conductive layers include a topmost select gate layer and, optionally, one or more lower select gate layers. Step 601 includes forming memory holes and depositing memory films in the memory holes. Step 602 includes performing plasma etching of the topmost select gate layer to form parallel select gate lines and a remaining portion of the topmost select gate layer. For example, see parallel select gate lines 801, 803, 805 and 807 and remaining portions 809 and 810 in FIG. 8A. Optionally, the select gate lines include parallel portions and non-parallel portions, or are non-parallel. The select gate lines can extend in any shape such a straight, L-shaped or U-shaped. Step 603 includes depositing an oxide in side trenches between the parallel select gate lines. For example, see FIG. 8A and side trenches 813, 814, 815, 816 and 817. Step 604 includes providing a protective material in end trenches between the parallel select gate lines and the remaining portion of the select gate layers. For example, see FIG. 8A and end trench 811. The protective material acts as an open circuit to prevent a current leakage. Generally, the protective material can be provided in any location in which a short circuit may occur. For instance, a select gate line can be surrounded by a protective material.

Figure 6B:
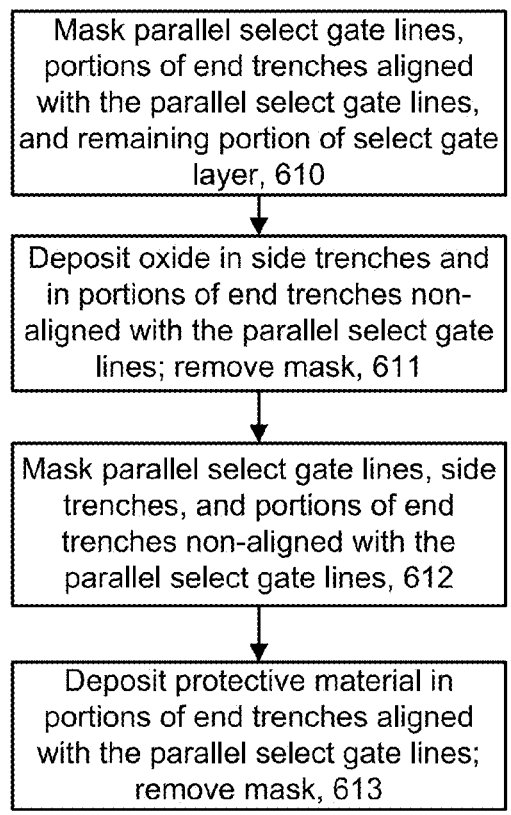
FIG. 6B depicts an example implementation of the process of FIG. 6A in which the protective material is discontinuous.

FIG. 6B depicts an example implementation of the process of FIG. 6A in which the protective material is discontinuous. When the protective material is discontinuous, a separate portion of the protective material may be provided at the end of each conductive line, and the separate portions are separated by a dielectric such as oxide. This approach can be used, e.g., when the protective material comprises a conductive material which is in contact with the conductive lines. See FIGS. 8B and 8C, for example. The discontinuous nature of the protective material avoids a short circuit between the conductive lines which would occur if a continuous conductive material were to be in contact with each conductive line. In this case, a discontinuous protective material may be used, e.g., when the protective material is a capacitor, diode, resistor or varistor.

Figure 8B:
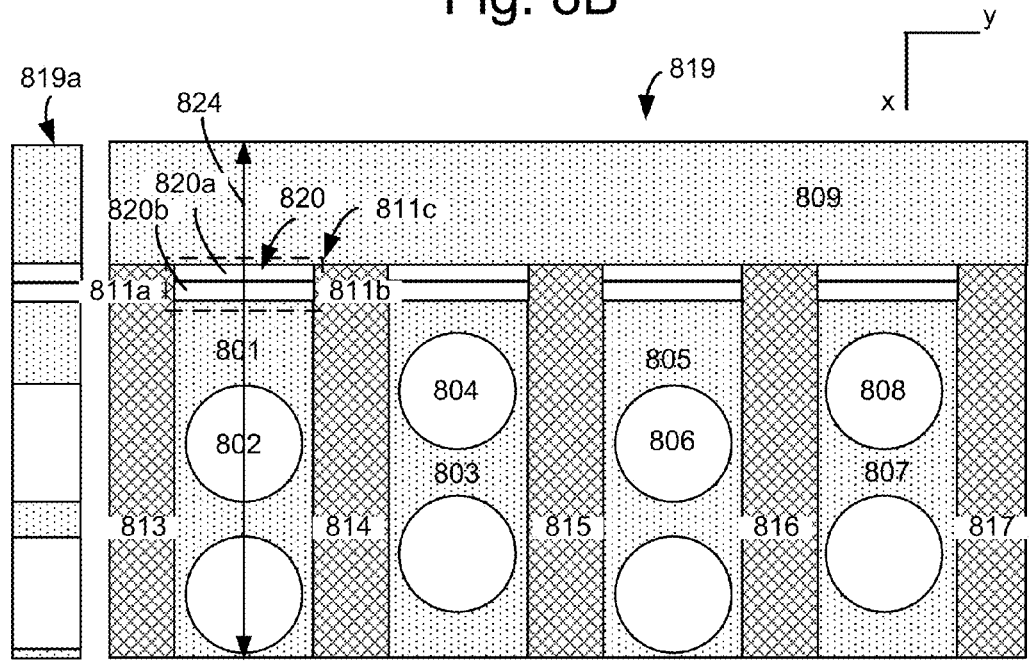
FIG. 8B depicts a view of a select gate layer 819 after processing of the select gate layer of FIG. 8A to provide a discontinuous two-layer protective material 820, consistent with FIG. 6B.
Figure 8C:
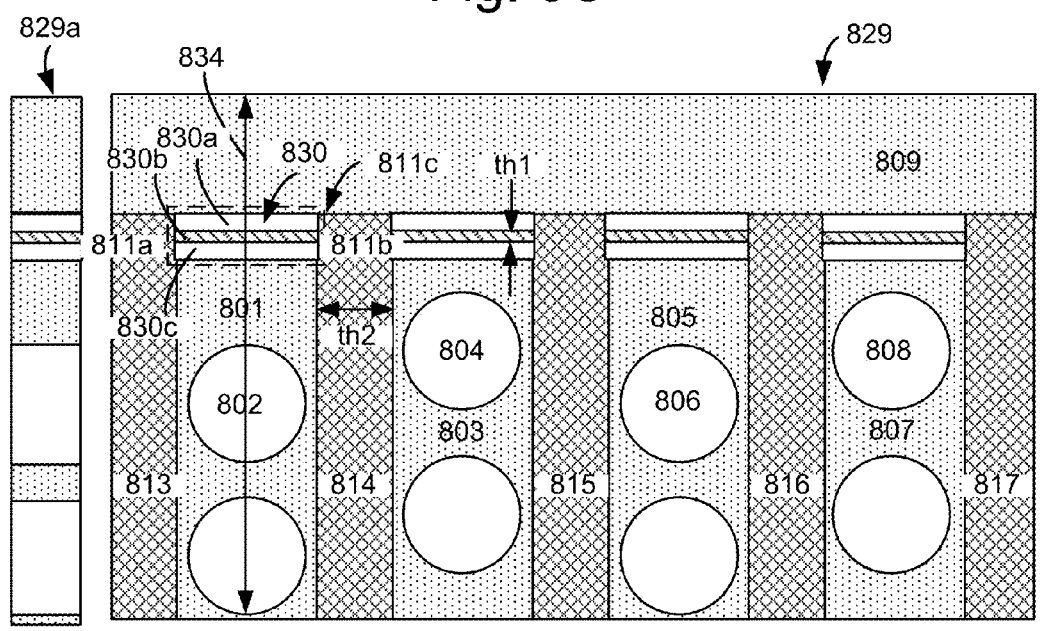
FIG. 8C depicts a view of a select gate layer 829 after processing of the select gate layer of FIG. 8A to provide a discontinuous three-layer protective material 830, consistent with FIG. 6C.

Step 610 comprises masking the parallel select gate lines (e.g., select gate lines 801, 803, 805 and 807 in FIG. 8A), portions of end trenches aligned with the parallel select gate lines (e.g., portion 811c in FIG. 8B or 8C), and a remaining portion of the select gate layer (e.g., remaining portion 809 in FIG. 8B or 8C). Step 611 comprises depositing oxide in the side trenches and in portions of the end trenches which are non-aligned with the parallel select gate lines (e.g., portion 811b in FIG. 8C), and removing the mask. Step 612 comprises masking the parallel select gate lines, side trenches, and portions of end trenches which are non-aligned with the parallel select gate lines. Step 613 comprises depositing a protective material in the portions of the end trenches which are aligned with the parallel select gate lines, and removing the mask. The protective material can comprise two or three portions, in some approaches.

Figure 8D:
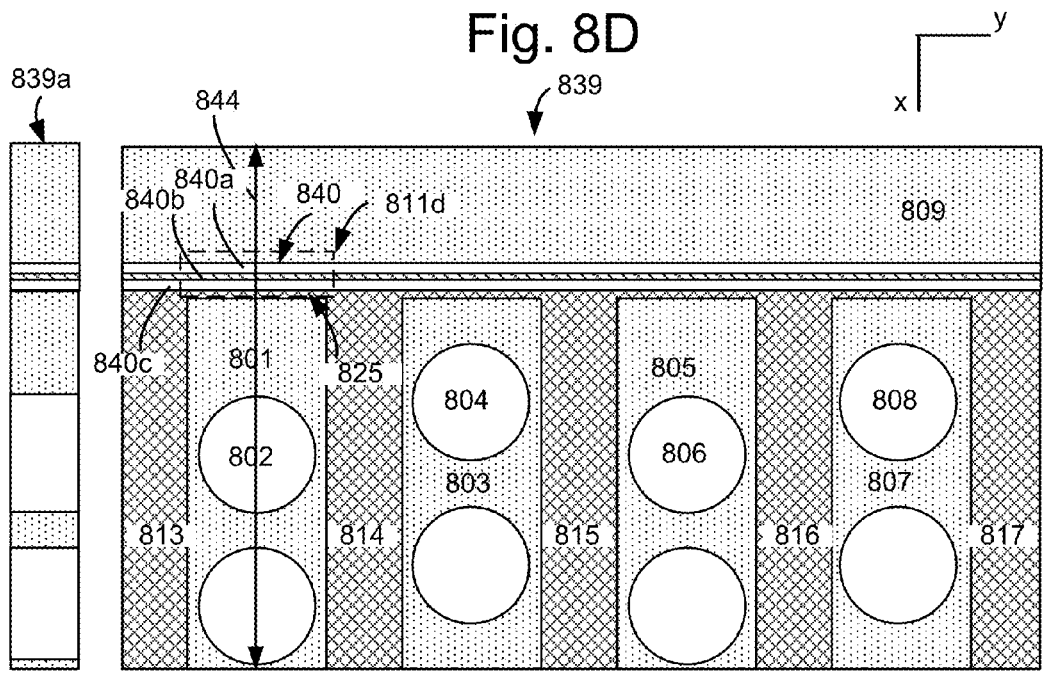
FIG. 8D depicts a view of a select gate layer 839 after processing of the select gate layer of FIG. 8A to provide a continuous three-layer protective material 840 and an end gap 825, consistent with FIG. 6C.

Optionally, the above-mentioned process provides an end gap which is an oxide-filled gap between the end of the conductive line and the protective material, such as the end gap 825 in FIG. 8D. In this case, since the protective material is not in contact with the conductive lines, the protective material can comprise a conductive material in contact with the oxide-filled end gap.

Note that the fabrication steps provided in this and other figures are intended to provide an example overview of one possible fabrication process among many. Moreover, not all steps are shown. Masking processes can involve use of a photoresist material, for instance, in which a desired pattern is made. Materials can be deposited using techniques such as chemical vapor deposition and atomic layer deposition. See FIG. 9A to 9J for further example fabrication details.

Figure 6C:
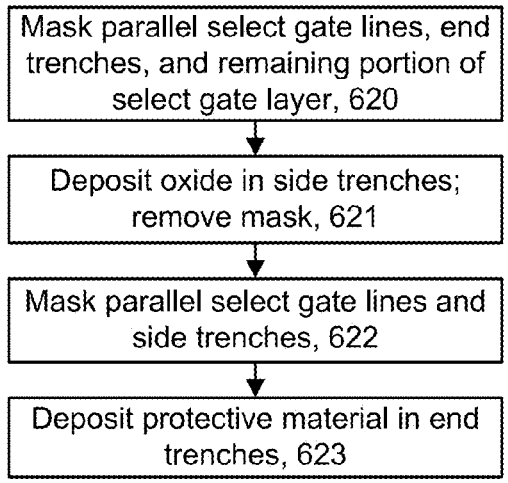
FIG. 6C depicts an example implementation of the process of FIG. 6A in which the protective material is continuous.

FIG. 6C depicts an example implementation of the process of FIG. 6A in which the protective material is continuous. This approach could be used for a varistor, for instance, in which a portion of the protective material which is in contact with the conductive lines is a dielectric such as oxide. This oxide can be the same as, or different than, the oxide in the side trenches. Step 620 includes masking the parallel select gate lines, the end trenches, and a remaining portion of select gate layer. Step 621 includes depositing an oxide in the side trenches and removing the mask. Step 622 includes masking the parallel select gate lines and the side trenches. Step 623 includes depositing protective material in the end trenches. For example, see the protective material 850 in FIG. 8E.

A further option is to provide an oxide-filled end gap 825 such as in FIG. 8D.

Figure 6D:
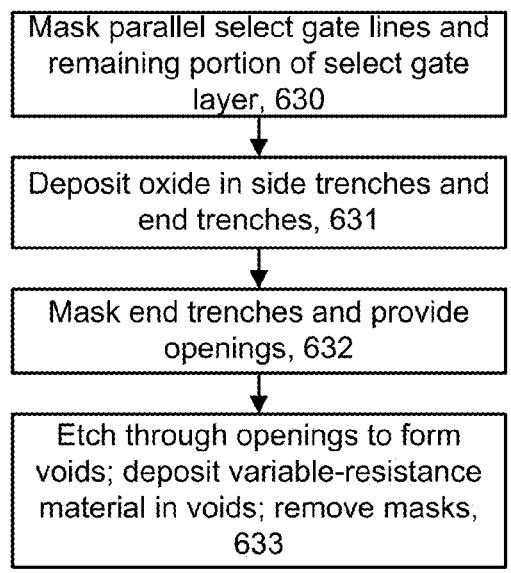
FIG. 6D depicts an example implementation of the process of FIG. 6A in which the protective material comprises a varistor.

FIG. 6D depicts an example implementation of the process of FIG. 6A in which the protective material comprises a varistor. Step 630 includes masking the parallel select gate lines and the remaining portion of the select gate layer. Step 631 includes depositing an oxide in the side trenches and the end trenches. Step 632 includes masking the end trenches and providing openings in the mask. Step 633 includes etching through the openings to form voids, depositing a variable-resistance material (e.g., ZnO2) in the voids, and removing the masks. For example, see FIG. 8F in which a varistor 860 is formed by providing a middle region 860b of a variable-resistance material in an oxide region at the end of the conductive lines. See FIG. 10A to 10H for further example fabrication details.

Figure 6E:
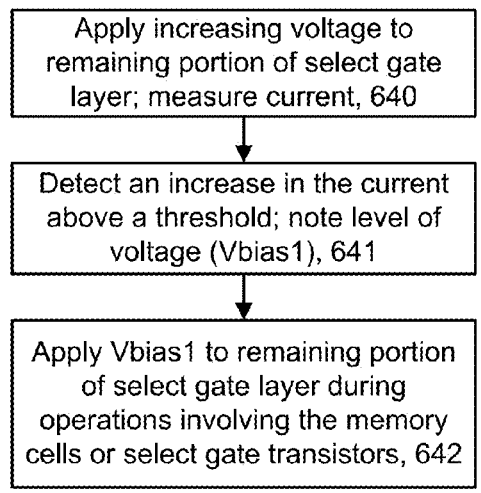
FIG. 6E depicts a process for determining a bias voltage for counteracting a short circuit in a select gate layer.

FIG. 6E depicts a process for determining a bias voltage for counteracting a short circuit in a select gate layer. This process can be performed as an alternative to providing the protective material. Or, the process could be performed in addition to providing the protective material when the addition of the protective material may still result in a short circuit. The process can be performed once, such as at the time of manufacture. Or, the process can be performed periodically when the memory device is in use by the end user. For example, the process can be performed at specified time intervals or intervals of program-erase cycles. Step 640 comprises applying an increasing voltage to a remaining portion of a select gate layer and measuring a current which flows, if any. As mentioned, short circuit paths which are weakly conductive may be created in the oxide of the topmost select gate layer. For example, see also FIG. 11B, where a tester/bias circuit 1151 (e.g., circuitry) can be used to apply the increasing voltage using a voltage driver 1153 and to concurrently measure a current which flows in a path 1170 through the topmost select gate lines including an example line 801. The current path can extend from the tester/bias circuit 1151 through one or more of the protective materials 1160 (comprising a resistance R and a capacitance C), through one or more select gate lines and through a ground path to a ground G. The measured current is essentially the combined leakage current through the select gate lines. See also FIG. 7A, which depicts an increase in Vbias with time and FIG. 7B, which depicts an increase in current with Vbias.

Step 641 comprises detecting an increase in the current above a threshold and noting a level of the voltage (Vbias1) when the current first exceeds the threshold. Generally, the current is expected to be relatively small until the applied voltage exceeds a breakdown voltage of the oxide near the conductive path, at which time the current rises relatively sharply. For example, see FIG. 7B which shows a current (I) increasing above a threshold level (I_threshold) when Vbias reaches a certain level (Vbias1). The threshold could be a predetermined level. Or, the threshold can be adaptively determined, e.g., by determining an initial current level when the voltage is initially applied at low level and setting the threshold at some level which is above the initial current level, e.g., 20-50% above. Another approach is to determine when the rate of the increase in current with the increase in Vbias exceeds a threshold rate.

Sometime later, step 642 comprises applying Vbias1 to the remaining portion of the select gate layer during operations involving the memory cells of the select gates. This bias reduces or prevents a leakage current from the select gate lines to the remaining portion. If the bias is too low, it may not adequately counter the leakage current from the select gate lines to the remaining portion. If the bias is too high, it may over-compensate and cause a current to flow from the remaining portion to the select gate lines, interfering with the operation of the associated select gate transistors. In one approach, the bias can be applied when the select gate lines are driven with a positive voltage or floated, and not applied when the select gate lines are grounded. The tester/bias circuit can therefore be controlled by a control circuit of the memory device which controls the voltage drivers of the select gate lines and therefore knows whether the select gate lines are driven with a positive voltage, floated or grounded. When the select gate lines are grounded, there is no voltage differential across the oxide which would cause a leakage current.

Figure 6F:
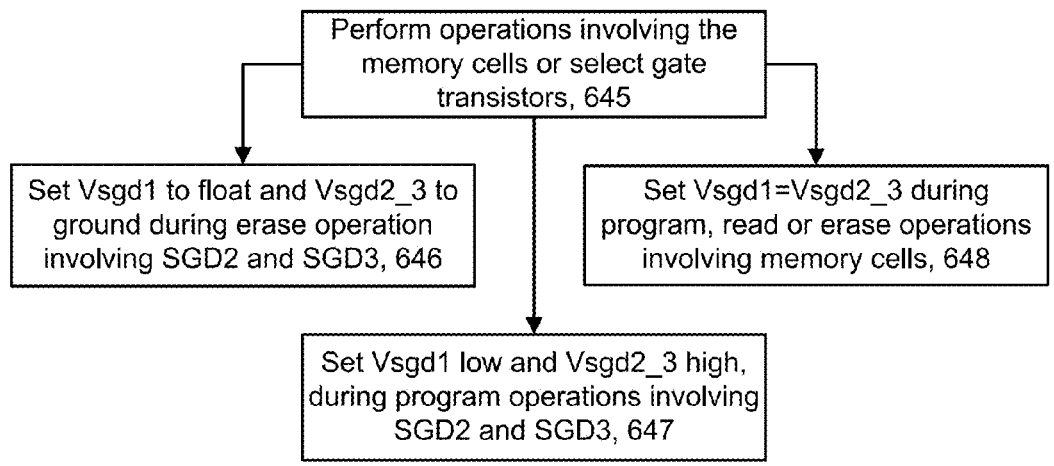
FIG. 6F depicts a process for performing operations involving the memory cells or select gate transistors.

FIG. 6F depicts a process for performing operations involving the memory cells or select gate transistors of a memory device. The top select gate lines can be controlled differently than the lower select gate lines in some cases due to the use of a protective material and/or a bias which counteracts a short circuit in the op select gate lines. This is based on a goal of avoiding a very high voltage on the top select gate lines which could damage the protective material, for instance. Step 645 includes performing operations involving the memory cells or select gate transistors. This can involve one of three paths. For example, step 646 involves setting Vsgd1 to float and Vsgd2_3 to ground during erase operations involving SGD2 and SGD3 transistors. As depicted in FIG. 11B, Vsgd1 is a voltage on the topmost select gate line and Vsgd2_3 is a voltage on the second and third select gate lines, which are joined together in this example. That is, in the SGD2 and SGD3 layers, each select gate line is electrically connected to the select gate line under it. Additional lower select gate lines could be used as well. Erase operations for select gate transistors are discussed further in connection with FIGS. 12A and 13A. Step 647 involves setting Vsgd1 low and Vsgd2_3 high during programming operations involving SGD2 and SGD3 transistor. For example, the low voltage can be sufficient to provide the SGD1 transistors in a conductive state, e.g., 2-4 V, and the high voltage can be a programming voltage of 15-25 V. Programming operations for select gate transistors are discussed further in connection with FIGS. 12B and 13B. Step 648 involves setting Vsgd1=Vsgd2_3 during program, read or erase operations involving the memory cells. For example, the voltage can be sufficient to provide the SGD1, SGD2 and SGD3 transistors in a conductive state. See also FIG. 12C.

Figure 7A:
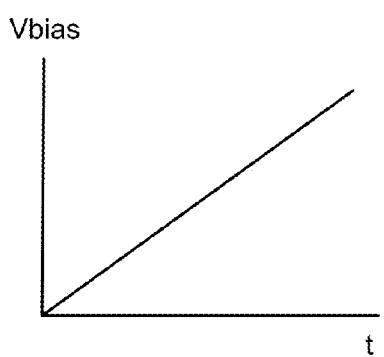
FIG. 7A depicts a plot of a bias voltage versus time, consistent with step 640 of FIG. 6E.

FIG. 7A depicts a plot of a bias voltage versus time, consistent with step 640 of FIG. 6E.

Figure 7B:
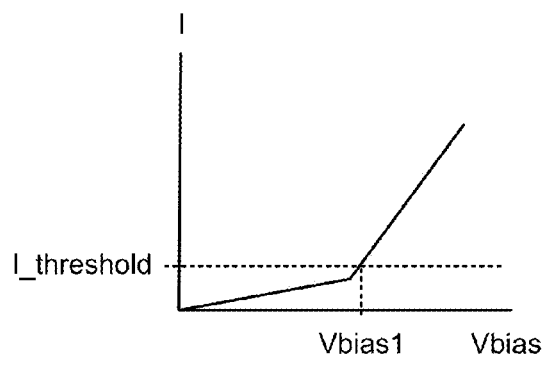
FIG. 7B depicts a plot of a current versus a bias voltage, showing the detection of an increase in a current above a threshold (I_threshold) and the determination of an optimal bias voltage (Vbias1) for counteracting a short circuit in a select gate layer time, consistent with step 641 of FIG. 6E.

FIG. 7B depicts a plot of a current versus a bias voltage, showing the detection of an increase in a current above a threshold (I_threshold) and the determination of an optimal bias voltage (Vbias1) for counteracting a short circuit in a select gate layer time, consistent with step 641 of FIG. 6E.

FIG. 8A depicts a top view of a select gate layer 800, including parallel select gate lines 801, 803, 805 and 807, remaining portions 809 and 810, end trenches 811 and 812 and side trenches 813, 814, 815, 816 and 817. Memory holes which are associated with the select gate lines include example memory holes 802, 804, 806 and 808. This view is analogous to FIG. 3B, which provides a straight NAND string embodiment. Portions of the underlying dielectric layer DL26 are also exposed in this view. The oval shaped regions such as regions 798a, 798b, 798c and 798d indicate where short circuit paths are most likely to occur. See also the oval shaped regions such as regions 797a, 797b, 797c and 797d in FIG. 14. In this example, the remaining portions are separate from one another. In other examples, a remaining portion could also extend along the sides, e.g., along the side trench 817 in an L shape or other shape. Other configurations are possible as well. The remaining portion is a remnant of the etching of the select gate lines. Furthermore, the protective material could be provided at one or both ends of the select gate lines or at other locations as well. A cross-sectional view 800a along the line 826 is also depicted.

Contacts c1, c2, c3 and c4 are provided on the select gate lines 801, 804, 805 and 807, respectively. The contacts may include vertical portions which extend up to a horizontal ground contact Cg. Cg in turn is connected to a ground via a switch (SW) such as in FIGS. 11A and 11B. This provides a ground path for testing for short circuits using a tester/bias circuit. See, e.g., FIGS. 11B and 14. The contacts are used in the embodiment of FIG. 6E in which Vbias is applied to the remaining portion of the select gate layer.

FIG. 8B depicts a view of a select gate layer 819 after processing of the select gate layer of FIG. 8A to provide a discontinuous two-layer protective material 820, consistent with FIG. 6B. For example, the two-layer protective material 820 can be a diode which includes one p-type polysilicon region 820a which contacts or otherwise is electrically connected to the remaining portion, and an n-type polysilicon region 820b which contacts or otherwise is electrically connected to one of the parallel select gate lines. The protective material is in a portion 811c of the end trench which is aligned with the select gate line 801. Portions 811a and 811b of the end trench are not aligned with a select gate line. The protective material could alternatively be a linear resistor.

The diode is reversed biased when the voltage on the select gate line is greater than the voltage on the remaining portion, so that a current flow from the select gate line to the remaining portion is blocked. The diode should have a breakdown voltage which is above the highest voltage which is expected on the select gate line. In one example, operations such as programming are not allowed on the topmost select gate line so that a high programming voltage such as 15-25 V is avoided. A voltage is allowed which is sufficient to provide the associated select gate transistors in a conductive state so that the select gate transistors can act as pass gates during operations involving the lower select gate transistors or the memory cells. A voltage of up to 4 V, for example, may be used. The breakdown voltage of the diode or other protective material may therefore be about 5-10 V, for instance. A cross-sectional view 819a of the select gate layer along the line 824 is also depicted.

FIG. 8C depicts a view of a select gate layer 829 after processing of the select gate layer of FIG. 8A to provide a discontinuous three-layer protective material 830, consistent with FIG. 6C. For example, the three-layer protective material 830 can be a capacitor, varistor, diode or linear resistor. For a capacitor, the outer regions 830a and 830c can be conductive materials such as doped polysilicon, while the middle region 830b is an oxide. The thickness (th1) of this oxide can be less than the thickness (th2) of the oxide in the side channels so that the protective material has a greater capacitance (C) than the oxide in the side channels. This is true since $C=\in A/d$, where e is the permittivity of the oxide in the middle region, A is the relevant area of the protective material, and d is the thickness th1. The capacitor or varistor acts to block a current flow from the select gate line to the remaining portion. A cross-sectional view 829a of the select gate layer along the line 834 is also depicted.

In the case of a resistor, the outer regions 830a and 830c can be n or p-type polysilicon, while the middle region 830b is intrinsic (i) polysilicon, for instance. Thus, a p-i-p or n-i-n resistor can be formed, where the resistor comprises an intrinsic polysilicon region between conductive polysilicon regions, and the conductive polysilicon regions are p-type or n-type.

In this example, the protective material comprises a capacitor, the capacitor comprises an oxide region between conductive materials, the oxide region has a thickness which is less than a thickness of the oxide in the side trenches, and the conductive materials comprise doped polysilicon.

FIG. 8D depicts a view of a select gate layer 839 after processing of the select gate layer of FIG. 8A to provide a continuous three-layer protective material 840 and an end gap 825, consistent with FIG. 6C. For example, the three-layer protective material 840 can be a capacitor, varistor, diode or linear resistor. The three-layer protective material 840 is in a region 811d of the end trench, where the region is aligned with the select gate line 801. For a capacitor, the outer regions 840a and 840c can be conductive materials such as doped polysilicon, while the middle region 840b is an oxide. A cross-sectional view 839a of the select gate layer along the line 844 is also depicted. The end gap provides an insulating barrier between the select gate lines and the protective material so that the region 840c of the protective material which is closest to the select gate lines can be formed of a conductive material without causing a short circuit connection between the select gate lines. Generally, it is desirable to have the ability to control each select gate line independently of the other select gate lines.

Figure 8E:
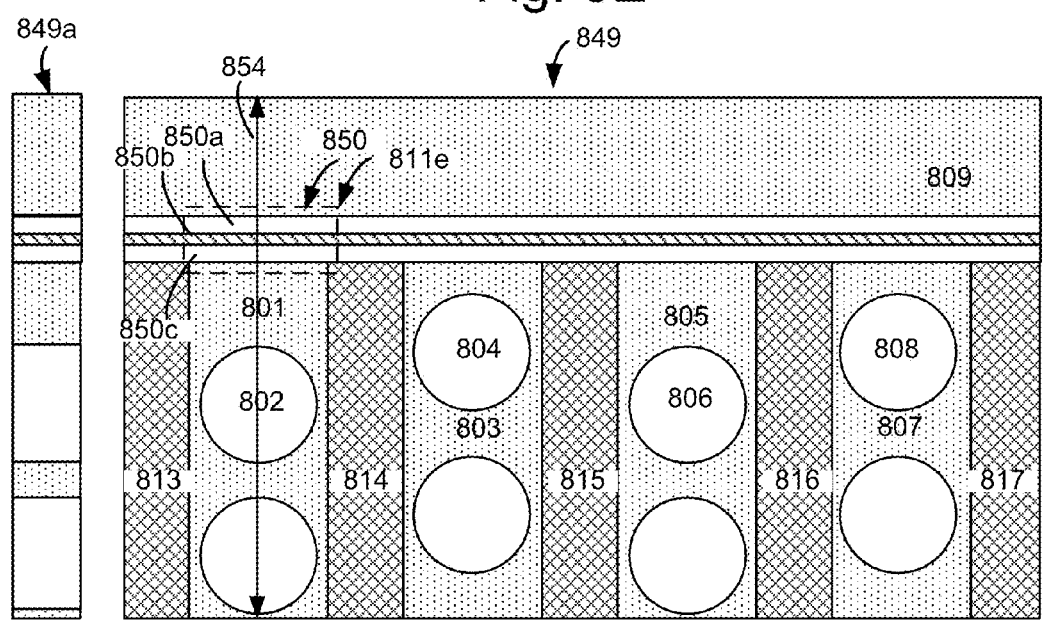
FIG. 8E depicts a view of a select gate layer 849 after processing of the select gate layer of FIG. 8A to provide a continuous three-layer protective material 850 and no end gap, consistent with FIG. 6C.

FIG. 8E depicts a view of a select gate layer 849 after processing of the select gate layer of FIG. 8A to provide a continuous three-layer protective material 850 and no end gap, consistent with FIG. 6C. For example, the three-layer protective material 850 can be a varistor, where the outer regions 850a and 850c can be oxide while the middle region 850b is ZnO2. A cross-sectional view 849a of the select gate layer along the line 854 is also depicted. The three-layer protective material 850 is in a region 811e of the end trench, where the region is aligned with the select gate line 801.

Figure 8F:
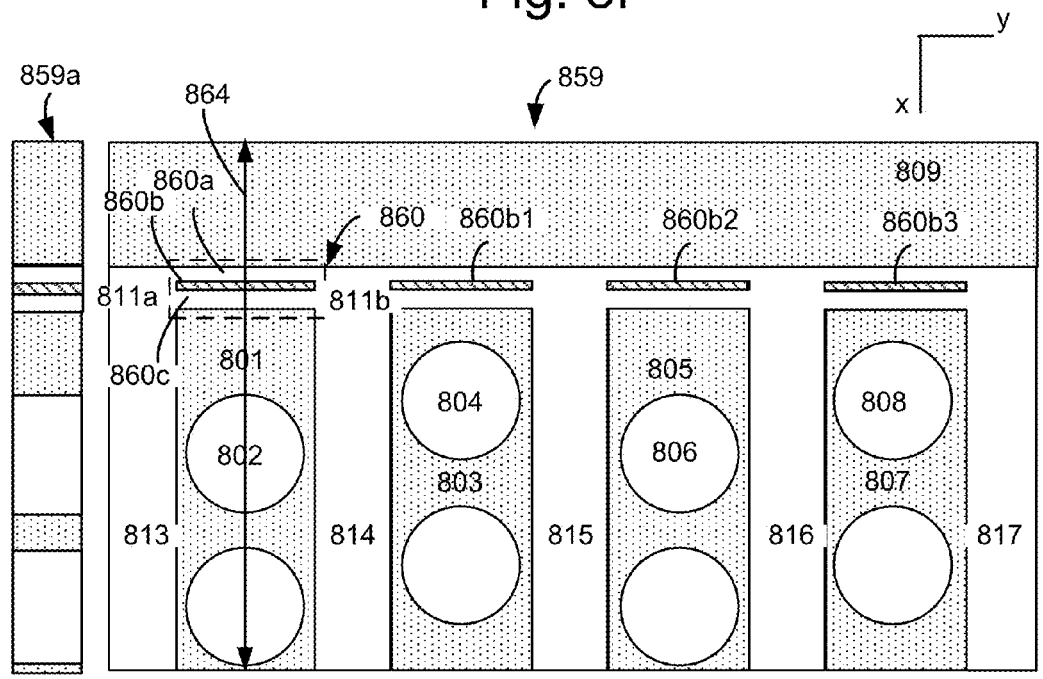
FIG. 8F depicts a view of a select gate layer 859 after processing of the select gate layer of FIG. 8A to provide a varistor 860 as the protective material, consistent with FIG. 6D.

FIG. 8F depicts a view of a select gate layer 859 after processing of the select gate layer of FIG. 8A to provide a varistor 860 as the protective material, consistent with FIG. 6D. In the varistor, the outer regions 860a and 860c can be oxide (e.g., silicon oxide) which is contiguous with the oxide in the side channels, while the middle region 860b is a variable-resistance material such as ZnO2 or other metal oxide. Thus, the protective material comprises a variable-resistance metal oxide between silicon oxide layers. Other varistors are associated with the middle regions 860b1, 860b2 and 860b3 to protect the select gate lines 803, 805 and 807, respectively. A cross-sectional view 859a of the select gate layer along the line 864 is also depicted.

Figure 8G:
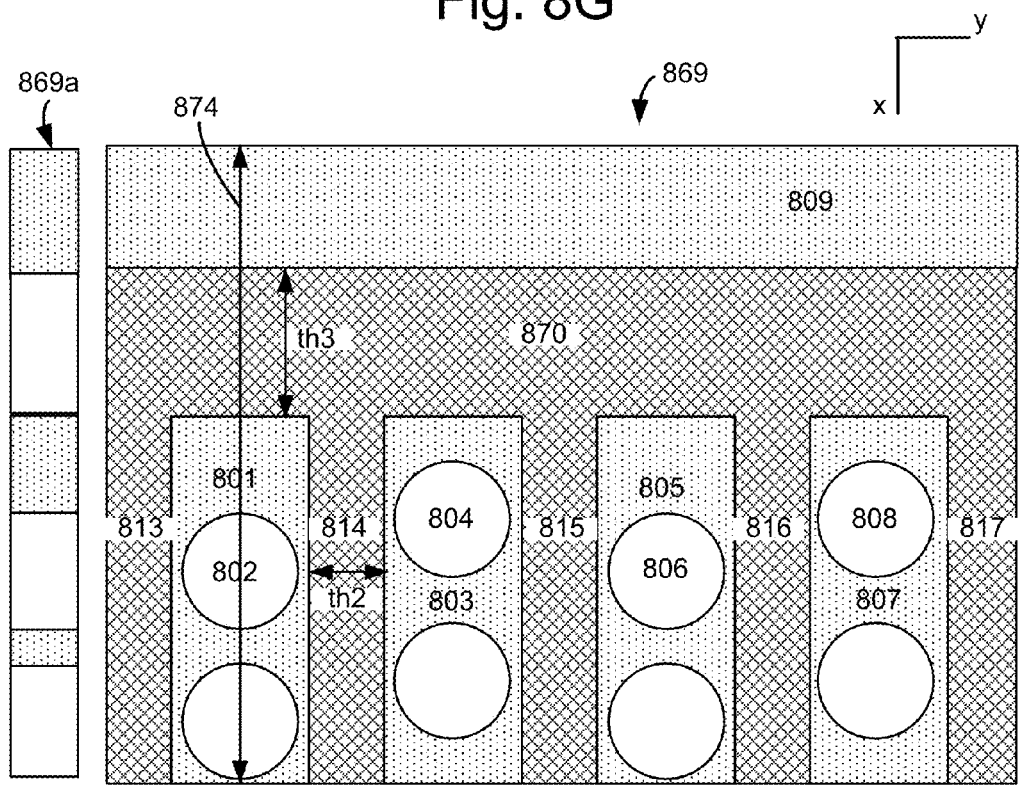
FIG. 8G depicts a view of a select gate layer 869 after processing of a modified version of the select gate layer of FIG. 8A to provide an end trench with a thickness th3 which is greater than a thickness th2 of the side trenches.

FIG. 8G depicts a view of a select gate layer 869 after processing of a modified version of the select gate layer of FIG. 8A to provide an end trench with a thickness th3 which is greater than a thickness th2 of the side trenches. This example increases the thickness so that the breakdown voltage increases. In this example, the same oxide can be used to fill the side trenches 813-817 and the end trench 870, but the thickness th3 of the end trench, e.g., the distance between the ends of the select gate lines and the remaining portion, is greater than the thickness th2 of the oxide in the side trenches. In this case, even if charges diffuse into the oxide in the end trenches, the thickness of the oxide may be sufficient to prevent a short circuit path. For example, th3 may be 1.5 or 2.0 or more times greater than th2. A cross-sectional view 869a of the select gate layer along the line 874 is also depicted.

Figure 8H:
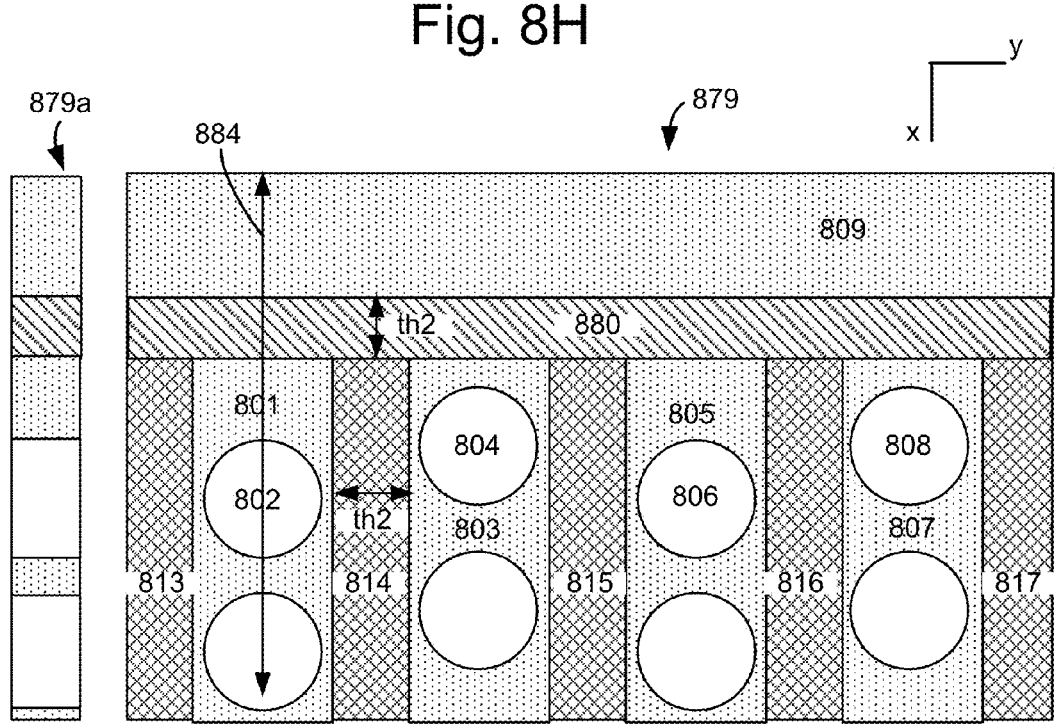
FIG. 8H depicts a view of a select gate layer 879 after processing of a modified version of the select gate layer of FIG. 8A to provide an end trench with a thickness th2 which is the same as the thickness of the side trenches.

FIG. 8H depicts a view of a select gate layer 879 after processing of a modified version of the select gate layer of FIG. 8A to provide an end trench with a thickness th2 which is the same as the thickness of the side trenches. This example uses a protective material in the end trench 880 which has a higher resistance to the diffusion of charges than the material in the side trenches. For example, the protective material in the end trench can have a higher dielectric constant (k) than the material in the side trenches. As an example, with silicon dioxide (SiO2, K~3.9) used in the side trenches, silicon monoxide (SiO, K~5.0) or silicon nitride (SiO3N4, K~6) can be used in the end trenches.

In another option, the protective material in the end trench 880 also has a larger thickness than th2. It is also possible to provide a combination of approaches. For example, the end trench can be thicker than the side trench and can have an additional material which has a higher resistance to the diffusion of charges than the material in the side trenches. A cross-sectional view 879a of the select gate layer along the line 884 is also depicted.

Figure 9A:
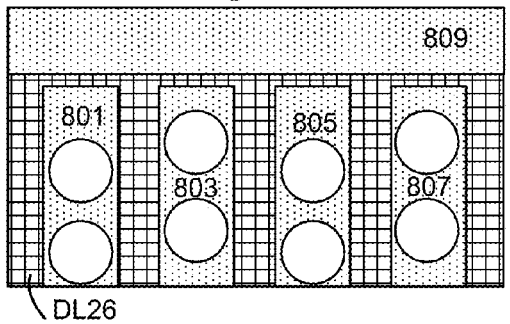
FIG. 9A to 9J depict a top view of a select gate layer in various phases of fabrication, consistent with the p-n diode of FIG. 8B.
Figure 9E:
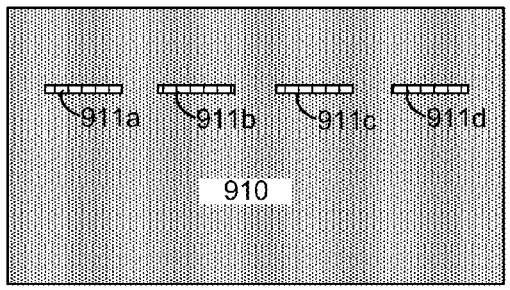
Figure 9B:
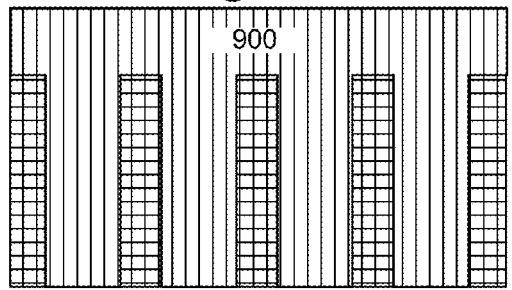
Figure 9F:
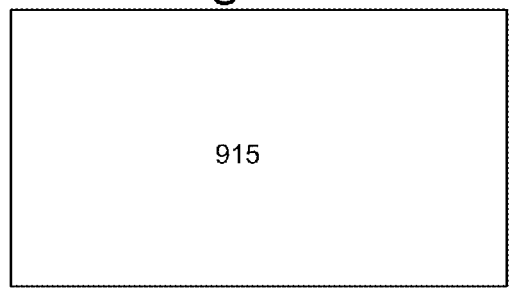
Figure 9C:
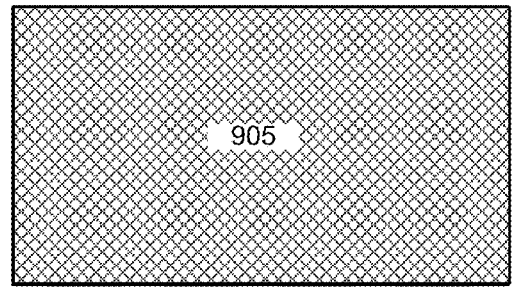
Figure 9G:
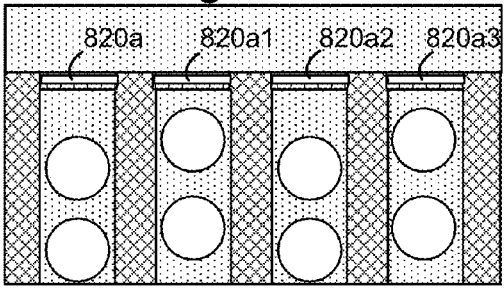
Figure 9D:
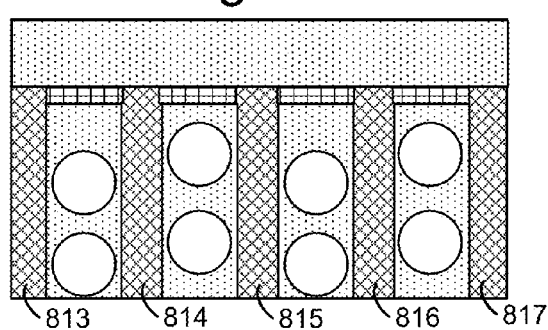
Figure 9H:
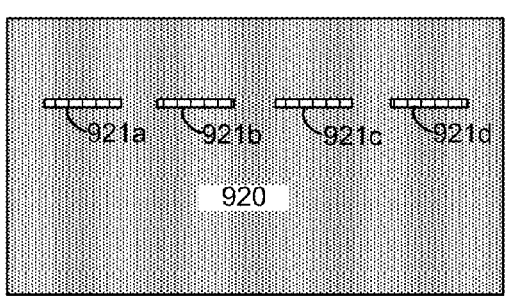
Figure 9I:
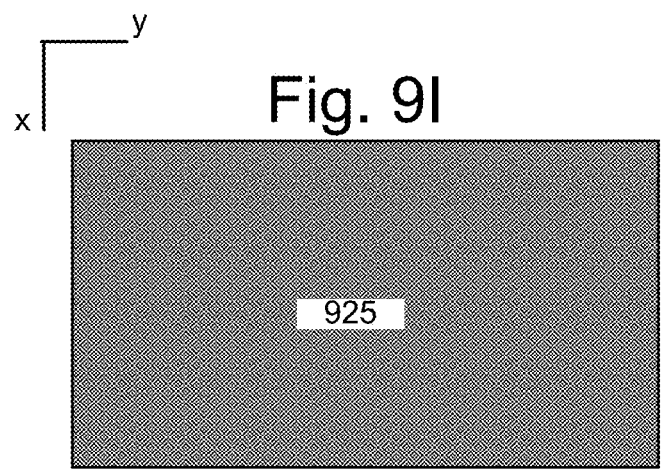
Figure 9J:
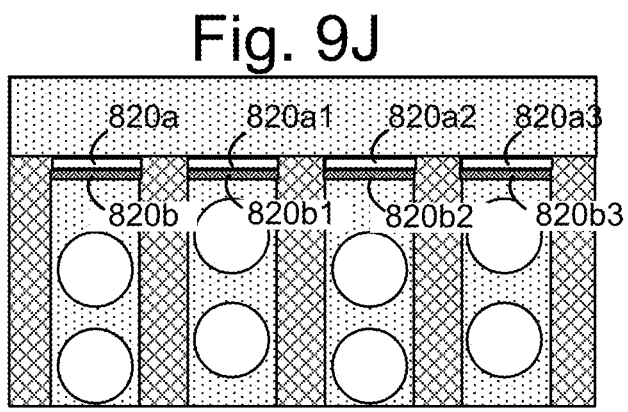

FIG. 9A to 9J depict a top view of a select gate layer in various phases of fabrication, consistent with the p-n diode of FIG. 8B. FIG. 9A depicts the remaining portion 809 of the select gate layer, the select gate lines 801, 803, 805 and 807, and the dielectric layer DL26, consistent with FIGS. 3C1 and 11A. At this point, the select gate layer has been etched. FIG. 9B depicts a mask 900 which is deposited over the remaining portion, the end trench and the select gate lines. FIG. 9C depicts an oxide layer 905 which is deposited. The oxide fills the side trenches. FIG. 9D depicts removal of the oxide from areas other than the side trenches, to form oxide regions in the side trenches 813-817, between the select gate lines. That is, the structure is made planar. The excess oxide can be removed by chemical-mechanical planarization (CMP) for example. FIG. 9E depicts deposition of a mask 910 and etching of voids 911a, 911b, 911c and 911d in the mask. FIG. 9F depicts applying a first conductive material 915, such as p-type polysilicon, which is deposited in the voids. FIG. 9G depicts removing the excess first conductive material and the mask, revealing the p-type regions 820a, 820a1, 820a2 and 820a3. FIG. 9H depicts deposition of a mask 920 and etching of voids 921a, 921b, 921c and 921d in the mask. FIG. 9I depicts applying a second conductive material 925, such as n-type polysilicon, which is deposited in the voids. FIG. 9J depicts removing the excess second conductive material and the mask, revealing the n-type regions 820b, 820b1, 820b2 and 820b3.

Other approaches are possible as well. For example, one void can be created for each diode, where undoped polysilicon is deposited in each void. The two regions of the polysilicon can subsequently be doped as p-type and n-type using appropriate masks.

Figure 10A:
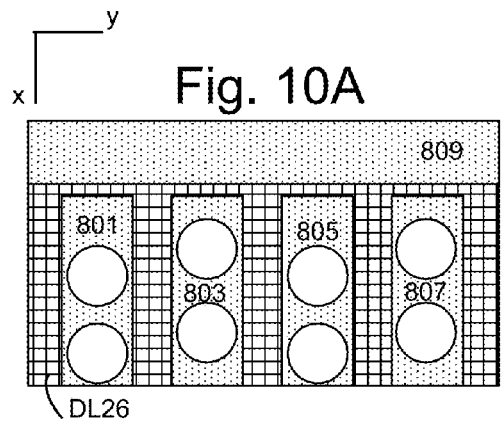
FIG. 10A to 10H depict a top view of a select gate layer in various phases of fabrication, consistent with the varistor of FIG. 8F.
Figure 10E:
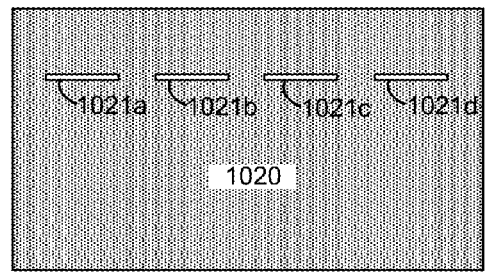
Figure 10B:
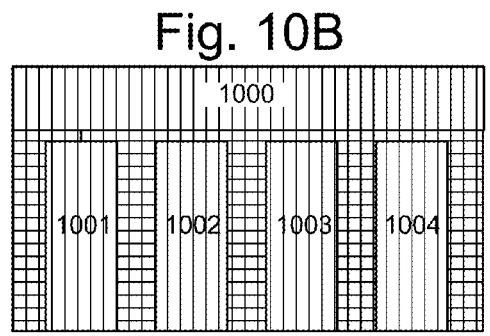
Figure 10F:
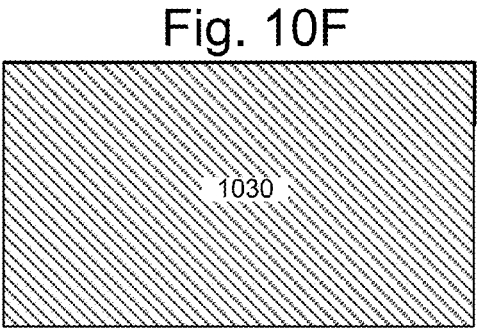
Figure 10C:
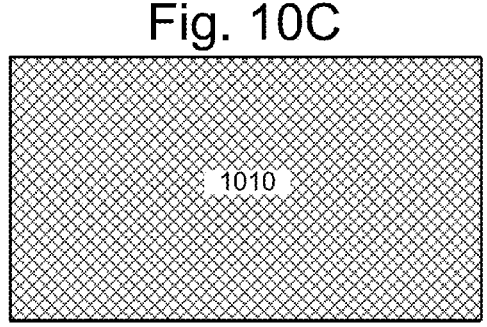
Figure 10G:
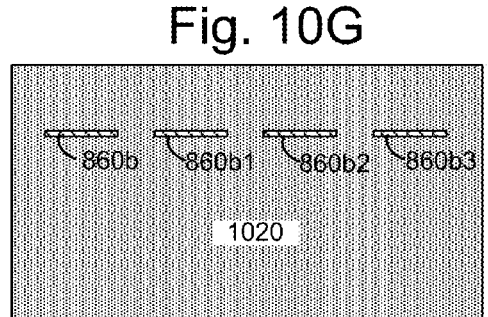
Figure 10D:
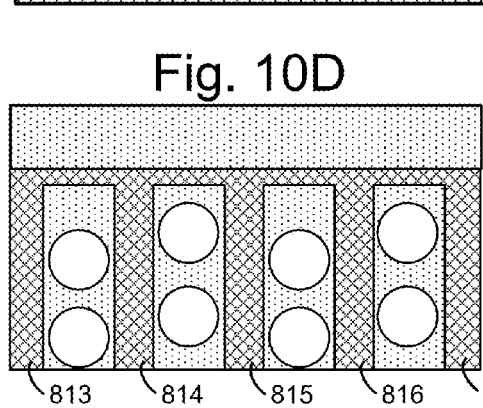
Figure 10H:
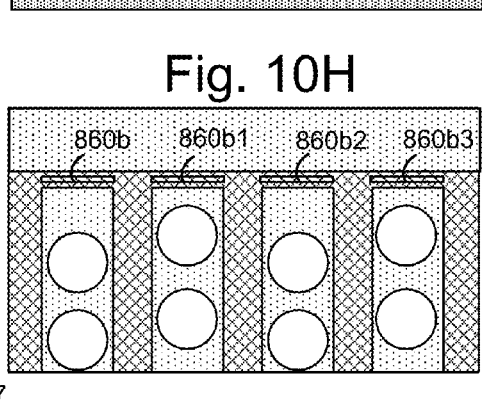

FIG. 10A to 10E depict a top view of a select gate layer in various phases of fabrication, consistent with the varistor of FIG. 8F. FIG. 10A depicts the remaining portion 809 of the select gate layer, the select gate lines 801, 803, 805 and 807, and the dielectric layer DL26, consistent with FIGS. 3C1 and 11A. FIG. 10B depicts a mask portion 1000 which is deposited over the end trench and mask portions 1001, 1002, 1003 and 1004 which have been deposited over the select gate lines. FIG. 10C depicts an oxide layer 1010 which is deposited. The oxide fills the side trenches. FIG. 10D depicts removal of the oxide and the mask from areas other than the side and end trenches, to form oxide regions in the side trenches 813-817, between the select gate lines. FIG. 10E depicts deposition of a mask 1020 and etching of voids 1021a, 1021b, 1021c and 1021d in the mask. FIG. 10F depicts applying a variable-resistance material 1030 such as zinc oxide, which is deposited in the voids. FIG. 10G depicts removing the excess variable-resistance material, revealing the regions 860b, 860b1, 860b2 and 860b3 of variable-resistance material and the mask 1020. FIG. 10H depicts removing the mask, revealing the varistors which include the regions 860b, 860b1, 860b2 and 860b3 of variable-resistance material.

Figure 11A:
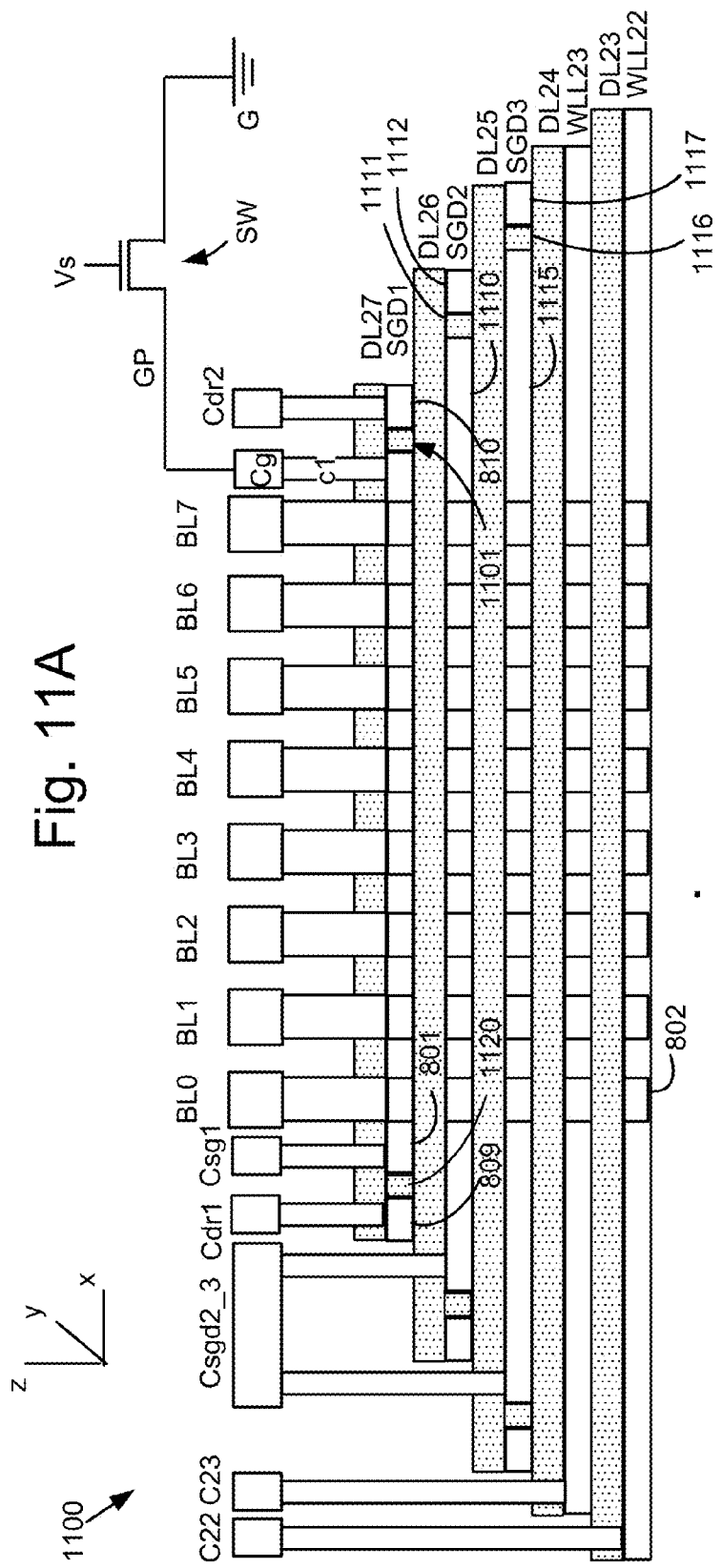
FIG. 11A depicts a side view of a 3D stacked non-volatile memory device, consistent with the process of FIG. 6E and with FIG. 3C1.
Figure 11B:
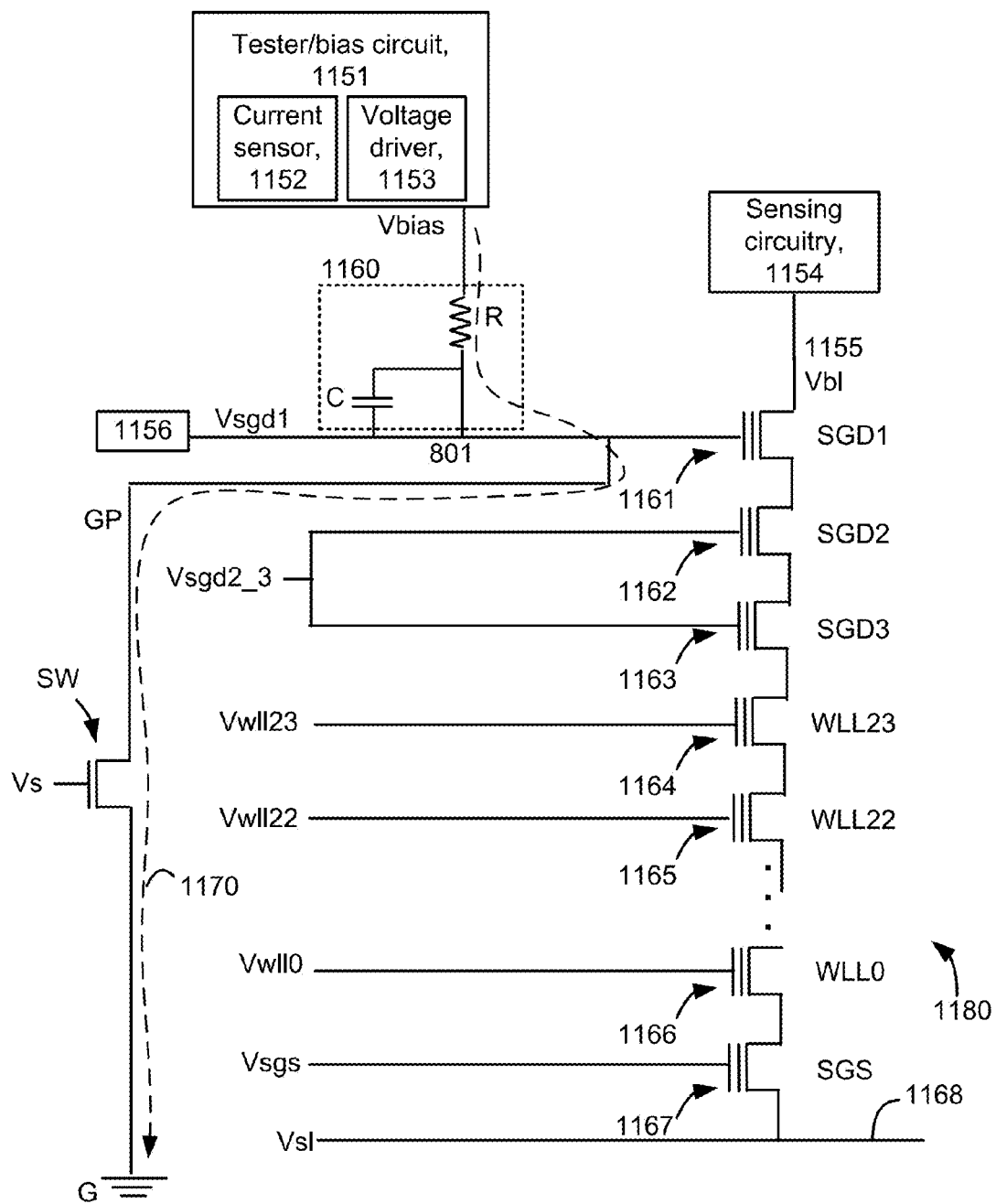
FIG. 11B depicts a circuit diagram consistent with FIG. 11A and the process of FIG. 6E.

FIG. 11A depicts a side view of a 3D stacked non-volatile memory device 1100, consistent with the process of FIG. 6E and with FIG. 3C1. An upper portion of the memory device is depicted, including WLL22, DL23, WLL23, DL24, SGD3, DL25, SGD2, DL26, SGD1 and DL27. The SGD3 layer includes an SGD line 1115, an end trench 1116 filled with oxide, and a remaining portion 1117. The SGD2 layer includes an SGD line 1110, an end trench 1111 filled with oxide, and a remaining portion 1112. The SGD1 layer includes an SGD line 801, an end trench filled with oxide 1120 and a remaining portion 809 at one end, and an end trench filled with oxide 1101 and a remaining portion 810 at another end. The top select gate layer corresponds to the structure of FIG. 14. In this example, protective material is not used. Instead, a bias is used to detect and counteract short circuits.

Additionally, contacts are provided for each conductive layer. C22 is provided for WLL22, C23 is provided for WLL23, Csgd2_3 is provided for SGD3 and SGD2, Cdr1 is provided for the remaining portion 809 of SGD1, Csg1 is provided for the SGD line 801, and Cdr2 is provided for the remaining portion 810 of SGD1. This example thus includes a contact for driving a bias on each of the remaining portions. Each contact includes a vertical via which extends upward from the contacted surface. Furthermore, the contacts may extend to associated circuits. A vertical contact c1 is connected to a horizontal ground contact Cg which in turn is connected to via a ground path GP and a switch SW to a ground G. The switch is provided in the path to close (make conductive) the ground path during the process of testing for short circuits and determining Vbias. The switch is open (in a non-conductive state) at other times such as during operations involving the select gate transistors or the memory cells. The switch is controlled by a control gate voltage Vs which can be set by the state machine or other control circuitry.

Memory holes which are associated with the SGD line 801 are also depicted, including the example memory hole 802. Rows of memory holes in the y direction are connected to a common bit line, e.g., BL0, BL1, BL2, BL3, BL4, BL5, BL6 or BL7.

FIG. 11B depicts a circuit diagram consistent with FIG. 11A and the process of FIG. 6E. As mentioned, a tester/bias circuit 1151 may be used to test for short circuits and to determine an optimal bias to use during subsequent operations in the memory device. This can be done separately for each remaining portion of the select gate layer. The tester/bias circuit includes a current sensor 1152 which detects a current which flows in a path 1170 through the protective material 1160 (having a resistance R and a capacitance C), the topmost select gate lines including an example line 801 and to a ground (G) which can be a p-type portion of the substrate or an external ground, external to the memory die 108 (FIG. 1B).

An example NAND string 1180 includes a topmost SGD transistor 1161, lower SGD transistors 1162 and 1163, memory cells 1164, 1165 and 1166, and an SGS transistor 1167. A bit line 1155 connects the drain end of the NAND string to sensing circuitry 1154, which is used to sense the NAND string during operations involving the select gate transistors and the memory cells. A source line 1168 is connected to a source end of the NAND string.

Voltage drivers can be used to provide voltages Vb1, Vsgd1, Vsgd2_3, Vw1123, Vw1122, . . . , Vw110, Vsgs and Vs1 on corresponding control lines as indicated. For example, a voltage driver 1156 is used to provide Vsgd1. In this example, a common voltage is provided to the two lower SGD transistors.

Figure 12A:
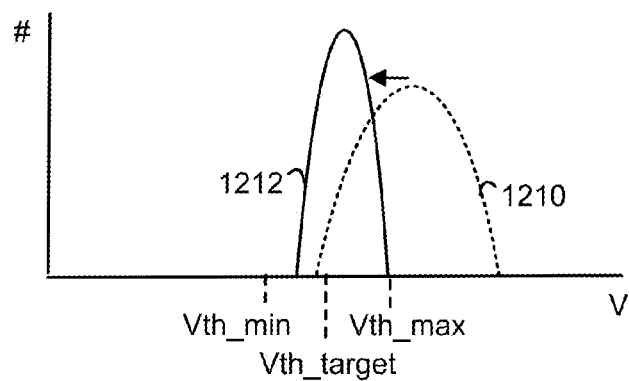
FIG. 12A depicts threshold voltage distributions during erasing of SGD transistors, consistent with step 646 of FIG. 6E.

FIG. 12A depicts threshold voltage distributions during erasing of SGD transistors, consistent with step 646 of FIG. 6E. To ensure proper operation, the threshold voltages (Vth) of the SGD transistors may be periodically evaluated and adjusted. An erase operation can be performed if the Vth is too high and a program operation can be performed if the Vth is too low. Vth_min and Vth_max are lower and upper boundaries of an acceptable range of Vth values for SGD transistors. Vth_target is midway between Vth_min and Vth_max. Curve 1210 represents a current Vth distribution for a set of SGD transistors. In this case, the median of the distribution is above Vth_target, so that an erase operation should be performed. Curve 1212 represents the final Vth distribution after erasing, where Vth_max is used as a verify level.

Figure 12B:
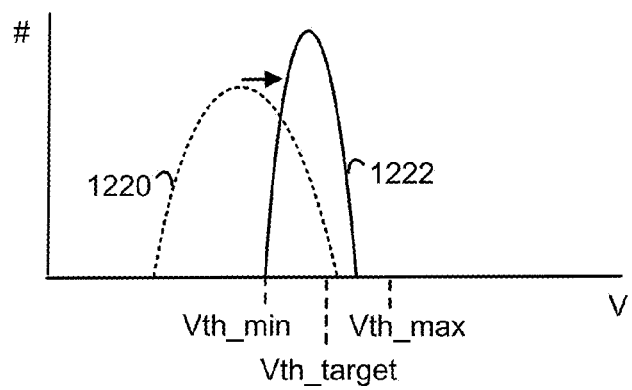
FIG. 12B depicts threshold voltage distributions during programming of SGD transistors, consistent with step 647 of FIG. 6E.

FIG. 12B depicts threshold voltage distributions during programming of SGD transistors, consistent with step 647 of FIG. 6E. Curve 1220 represents a current Vth distribution for a set of SGD transistors. In this case, the median of the distribution is below Vth_target, so that a program operation should be performed. Curve 1222 represents the final Vth distribution after programming, where Vth_min is used as a verify level.

Figure 12C:
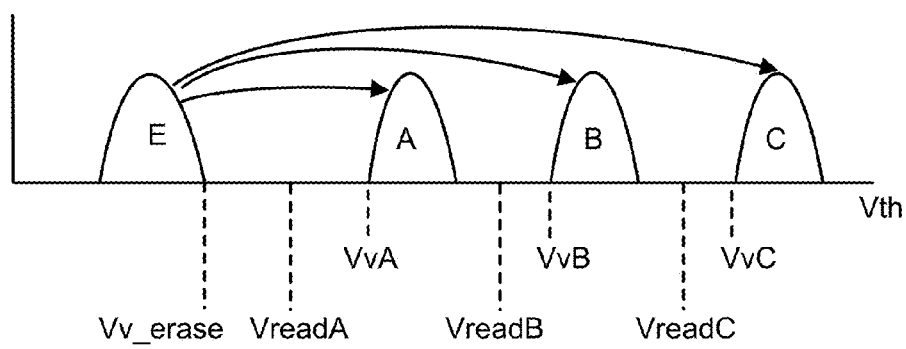
FIG. 12C depicts threshold voltage distributions of memory cells during program, read or erase operations, consistent with step 648 of FIG. 6E.

FIG. 12C depicts threshold voltage distributions of memory cells during program, read or erase operations, consistent with step 648 of FIG. 6E. Memory cells can be programmed so that their threshold voltages are in respective ranges which represent data states. Initially, an erase operation is performed which places all of the storage elements in the erased state (E). Subsequently, some of the storage elements can be programmed to a higher threshold voltage such as to represent the A, B or C data states. The x-axis indicates a threshold voltage and the y-axis indicates a number of storage elements. Memory devices with additional data states, e.g., eight or sixteen data states, can also be used. Read operations can use the voltages VreadA, VreadB and VreadC to distinguish between the different data states. During programming, read or verify operations uses the voltages VvA, VvB and VvC.

FIG. 13A depicts an example waveform during erasing of SGD transistors, consistent with step 646 of FIG. 6E. The waveform depicts a series of erase pulses and verify pulses in an erase operation, where the bit line voltage Vbl_erase is stepped up until a maximum is reached, or until a verify test is passed, at which point the erase operation is concluded. The waveform 1300 represents a number of erase-verify iterations EV0, EV1, EV2, . . . . Each erase-verify iteration includes an erase pulse 1301-1305 followed by a verify pulse (such as verify pulse 1309) of magnitude Vth_max, for instance. In this example, Verase is stepped up in each iteration by a step size Vbl_erase_step. The step size can be uniform or non-uniform. The erase pulses 1301, 1302, 1303, 1304 and 1305 have peak amplitudes of Vbl_erase0, Vbl_erase1, Vbl_erase2, Vbl_erase3 and Vbl_erase4, respectively.

The erase of a memory cell can use a similar waveform, although typically higher magnitude voltages are used than when an SGD transistor is erased.

The following voltages can be used during each erase pulse during the erase of an SGD transistor: Vsgd_sel (0 V); Vsgd_unsel (float); Vbl_sel (erase pulse magnitude); Vbl_unsel (0 V); and Vwl and Vbg, Vsgs (float). Vsgd_sel is the control gate voltage of a selected SGD transistor which is erased. Vsgd_unsel is the control gate voltage of an unselected SGD transistor which is not erased. Vbl_sel is the voltage of a selected bit line connected to a NAND string in which an SGD transistor is being erased. Vbl_unsel is the voltage of an unselected bit line connected to a NAND string in which an SGD transistor is not being erased. Vwl is the control gate voltage of a memory cell. Vbg is a back gate voltage, for a U-shaped NAND string. Vsgs is the control gate voltage of an SGS transistor.

FIG. 13B depicts an example waveform during programming of SGD transistors, consistent with step 647 of FIG. 6E. The waveform depicts a series of program pulses and verify pulses in a programming operation, where the SGD transistor control gate voltage Vsgd_pgm is stepped up until a maximum is reached, or until a verify test is passed, at which point the programming operation is concluded. The waveform 1350 represents a number of program-verify iterations PV0, PV1, PV2, . . . . Each program-verify iteration includes a program pulse 1351-1355 followed by a verify pulse such as verify pulse 1359 of magnitude Vth_min, for instance. In this example, Vsgd_pgm is stepped up in each iteration by a step size Vsgd_pgm_step. The step size can be uniform or non-uniform. The program pulses 1351, 1352, 1353, 1354 and 1355 have peak amplitudes of Vsgd_pgm0, Vsgd_pgm1, Vsgd_pgm2, Vsgd_pgm3 and Vsgd_pgm4, respectively.

The programming of a memory cell can use a similar waveform, although typically higher magnitude voltages are used than when an SGD transistor is programmed.

The following voltages can be used during the programming of an SGD transistor: Vsgd_sel (program pulse magnitude); Vbl_sel (0 V); Vbl_unsel (inhibit); and Vwl, Vsl, Vbg, Vsgs and Vsgd_unsel (float). Vsgd_sel is the control gate voltage of a selected SGD transistor which is programmed Vbl_sel is the voltage of a selected bit line connected to a NAND string in which an SGD transistor is being programmed Vbl_unsel is the voltage of an unselected bit line connected to a NAND string in which an SGD transistor is not being programmed Vwl is the control gate voltage of a memory cell. Vsl is the source line voltage. Vbg is a back gate voltage, for a U-shaped NAND string. Vsgs is the control gate voltage of an SGS transistor. Vsgd_unsel is the control gate voltage of an unselected SGD transistor which is not programmed.

The following voltages can be used during the erase of a memory cell: Vsl_sel and Vbl_sel (erase pulse level), Vsl_unsel and Vbl_unsel (inhibit); Vsgs_sel and Vsgd_sel (conductive state), Vsgs_unsel and Vsgd_unsel (float), Vwl_sel (float, then drive to 0 V during erase pulse) and Vwl_unsel (float). Vsl_sel is a voltage on a source line which is connected to a NAND string in which a memory cell is being erased.

Vsl_unsel is a voltage on a source line which is not connected to a NAND string in which a memory cell is being erased. Vbl_sel is the voltage of a selected bit line connected to a NAND string in which a memory cell is being erased. Vsl_unsel is the voltage of a source line connected to a NAND string in which a memory cell is not being erased. Vbl_unsel is the voltage of a selected bit line connected to a NAND string in which a memory cell is not being erased. Vsgs_sel is the control gate voltage of an SGS transistor in a NAND string in which a memory cell is being erased. Vsgd_sel is the control gate voltage of an SGD transistor in a NAND string in which a memory cell is being erased. Vsgs_unsel is the control gate voltage of an SGS transistor in a NAND string in which a memory cell is not being erased. Vsgd_unsel is the control gate voltage of an SGD transistor in a NAND string in which a memory cell is not being erased. Vwl_sel is the control gate voltage of a memory cell which is being erased. Vwl_unsel is the control gate voltage of a memory cell which is not being erased. Vsl_sel is the voltage of a source line connected to a NAND string in which a memory cell is being erased.

Similarly, the following voltages can be used during the programming of a memory cell: Vwl_sel (program pulse magnitude); Vbl_sel (0 V); Vbl_unsel (inhibit); and Vwl_unsel, Vsl, Vbg, Vsgs and Vsgd_unsel (float). Vwl_sel is the control gate voltage of a memory cell which is being programmed Vbl_sel is the voltage of a selected bit line connected to a NAND string in which a memory cell is being programmed Vbl_unsel is the voltage of a selected bit line connected to a NAND string in which a memory cell is not being programmed Vwl_unsel is the control gate voltage of a memory cell which is not being programmed Vsl is the voltage of a source line. Vbg is a back gate voltage, for a U-shaped NAND string. Vsgs is the control gate voltage of an SGS transistor. Vsgd_unsel is the control gate voltage of an SGD transistor in a NAND string in which a memory cell is not being programmed.

Additionally, during a read operation for an SGD transistor, a demarcation voltage is provided on the control gate of the transistor while a bit line voltage is supplied using sensing circuitry. A decay in the bit line voltage is measured. A substantial decay, below a threshold at specified time, indicates the Vth of the transistor is not above the demarcation voltage. Vwl, Vbg and Vsgs are set to provide the associated memory cells and transistors in a conductive state.

Similarly, during a read operation for a memory cell, a demarcation voltage is provided on the control gate of the memory cell while a bit line voltage is supplied using sensing circuitry. A decay in the bit line voltage is measured. A substantial decay, below a threshold at specified time, indicates the Vth of the memory cell is not above the demarcation voltage. Vw1, Vbg, Vsgd and Vsgs are set to provide the associated memory cells and transistors in a conductive state.

FIG. 14 depicts a view of a select gate layer 889 after depositing oxide in side trenches in the select gate layer of FIG. 8A and while using a tester/bias circuit 1151 to test for short circuits. The test/bias circuit provides Vbias to the remaining portion 809, resulting in current paths through each of the select gate lines via the oxide regions 798*a*, 798*b*, 798*c* and 798*d*. The current paths converge at the horizontal ground contact Cg and flow to ground G. In some cases, a current may not flow through a select line. The tester/bias circuit could also be connected to the remaining portion 810 to detect short circuits through the oxide regions 797*a*, 797*b*, 797*c* and 797*d*.

Accordingly, it can be seen that, in one embodiment, a memory device (100) comprises: a stacked three-dimensional memory structure (231) comprising alternating conductive layers (WLL0-WLL21, SGL1-SGL3; WLL0-WLL23, SGD1-SGD3) and dielectric layers (DL0-DL25; DL0-DL27), the conductive layers comprising a select gate layer (SGL1, SGL2, SGL3, SGD1, SGD2, SGD3), the select gate layer comprises parallel select gate lines (801, 803, 805, 807) and a remaining portion (809, 810) of the select gate layer, the remaining portion of the select gate layer extends transversely to the parallel select gate lines and is separated from the parallel select gate lines by an end trench (811, 812) at one end the of parallel select gate lines, the parallel select gate lines are separated from one another by side trenches (813, 814, 815, 816, 817), the end trench is connected to the side trenches, an oxide is provided in the side trenches, a protective material (820, 830, 840 850, 860, 870, 880) is provided in the end trench, and a breakdown voltage of the protective material is higher than a breakdown voltage of the oxide in the side trenches.

In another embodiment, a method for fabricating a memory device comprises: forming a stacked three-dimensional memory structure (231) comprising alternating conductive layers (WLL0-WLL21, SGL1-SGL3; WLL0-WLL23, SGD1-SGD3) and dielectric layers (DL0-DL25; DL0-DL27), a topmost layer of the conductive layers is a select gate layer; performing plasma etching of the select gate layer to form parallel select gate lines (801, 803, 805, 807) and a remaining portion (809, 810) of the select gate layer, the remaining portion of the select gate layer extends transversely to the parallel select gate lines and is separated from the parallel select gate lines by an end trench at one end the of parallel select gate lines, the parallel select gate lines are separated from one another by side trenches, the end trench is connected to the side trenches; depositing an oxide in the side trenches; and depositing a protective material in the end trench, a breakdown voltage of the protective material is higher than a breakdown voltage of the oxide in the side trenches.

In another embodiment, a method for controlling a memory device comprises: applying a voltage to a remaining portion (809, 810) of a select gate layer in a stacked three-dimensional memory structure, the stacked three-dimensional memory structure comprising alternating conductive layers (WLL0-WLL21, SGL1-SGL3; WLL0-WLL23, SGD1-SGD3) and dielectric layers (DL0-DL25; DL0-DL27), the select gate layer is one of the conductive layers and comprises parallel select gate lines (801, 803, 805, 807), the remaining portion of the select gate layer extends transversely to the parallel select gate lines and is separated from the parallel select gate lines by an end trench at one end the of parallel select gate lines, the parallel select gate lines are separated from one another by side trenches, the end trench is connected to the side trenches, an oxide is provided in the end trench and an oxide is provided in the side trenches; detecting a short circuit path in the oxide in the end trench during the applying the voltage; determining a voltage level for counteracting the short circuit path; and biasing the remaining portion during an operation in the stacked three-dimensional memory structure using the voltage level for counteracting the short circuit path.

In another embodiment, a memory device comprises: a stacked three-dimensional memory structure comprising alternating conductive layers (WLL0-WLL21, SGL1-SGL3; WLL0-WLL23, SGD1-SGD3) and dielectric layers (DL0-DL25; DL0-DL27), the conductive layers comprising a select gate layer, the select gate layer comprises parallel select gate lines (801, 803, 805, 807) and a remaining portion (809, 810) of the select gate layer, the remaining portion of the select gate layer extends transversely to the parallel select gate lines and is separated from the parallel select gate lines by an end trench at one end of the of parallel select gate lines, the parallel select gate lines are separated from one another by side trenches, the end trench is connected to the side trenches, an oxide is provided in the side trenches and in the end trench; and circuitry. The circuitry applies a voltage to the remaining portion, detecting a short circuit path in the oxide in the end trench while the voltage is applied, determines a voltage level for counteracting the short circuit path, and biases the remaining portion during an operation in the stacked three-dimensional memory structure using the voltage level for counteracting the short circuit path.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for controlling a memory device, comprising:
applying a voltage to a remaining portion of a select gate layer in a stacked three-dimensional memory structure, the stacked three-dimensional memory structure comprising alternating conductive layers and dielectric layers, the select gate layer is one of the conductive layers and comprises parallel select gate lines, the remaining portion of the select gate layer extends transversely to the parallel select gate lines and is separated from the parallel select gate lines by an end trench at one end the of parallel select gate lines, the parallel select gate lines are separated from one another by side trenches, the end trench is connected to the side trenches, an oxide is provided in the end trench and an oxide is provided in the side trenches;
detecting a short circuit path in the oxide in the end trench during the applying the voltage;
determining a voltage level for counteracting the short circuit path; and biasing the remaining portion of the select gate layer during an operation in the stacked three-dimensional memory structure using the voltage level for counteracting the short circuit path.

2. The method of claim 1, wherein:
the voltage applied to the remaining portion of the select gate layer varies;
the detecting the short circuit path comprises detecting a value of the voltage applied to the remaining portion of the select gate layer which results in an increase in a current through the remaining portion of the select gate layer above a threshold level; and
the voltage level for counteracting the short circuit path is based on the value of the voltage applied to the remaining portion of the select gate layer which results in the increase in the current through the remaining portion of the select gate layer above the threshold level.

3. The method of claim 2, wherein:
the voltage level for counteracting the short circuit path is at least as high as the value of the voltage applied to the remaining portion of the select gate layer which results in the increase in the current through the remaining portion of the select gate layer above the threshold level.

4. The method of claim 1, wherein:
the voltage applied to the remaining portion of the select gate layer varies;
the detecting the short circuit path comprises detecting a value of the voltage applied to the remaining portion of the select gate layer which results in a rate of increase in a current through the remaining portion of the select gate layer above a threshold rate; and
the voltage level for counteracting the short circuit path is based on the value of the voltage applied to the remaining portion of the select gate layer which results in the rate of increase in the current through the remaining portion of the select gate layer above the threshold rate.

5. The method of claim 4, wherein:
the voltage level for counteracting the short circuit path is at least as high as the value of the voltage applied to the remaining portion of the select gate layer which results in the rate of increase in the current through the remaining portion of the select gate layer above the threshold rate.

6. The method of claim 1, wherein:
the detecting the short circuit path in the oxide in the end trench and the determining the voltage level for counteracting the short circuit path occurs while the voltage applied to the remaining portion of the select gate layer varies.

7. The method of claim 1, wherein:
the operation comprises at least one of a programming, read or erase operation for a select gate transistor.

8. The method of claim 1, wherein:
the operation comprises at least one of a programming, read or erase operation for a memory cell.

9. The method of claim 1, wherein:
during the operation, a bias is applied to the parallel select gate lines to provide associated select gate transistors in a conductive state.

10. The method of claim 1, wherein:
the parallel select gate lines are connected to a ground via a switch; and
the switch is provided in a conductive state during the during the applying the voltage and in a non-conductive state during the operation.

11. A method for controlling a memory device, comprising:

applying a varying voltage to a remaining portion of a select gate layer in a stacked three-dimensional memory structure, the stacked three-dimensional memory structure comprising alternating conductive layers and dielectric layers, the select gate layer is one of the conductive layers and comprises parallel select gate lines, the remaining portion of the select gate layer extends transversely to the parallel select gate lines and is separated from the parallel select gate lines by an end trench at one end the of parallel select gate lines, the parallel select gate lines are separated from one another by side trenches, the end trench is connected to the side trenches, an oxide is provided in the end trench and an oxide is provided in the side trenches;
measuring a current in the remaining portion of the select gate layer of the select gate layer;
detecting a level of the varying voltage when the measuring indicates a short circuit path is present in the oxide in the end trench; and
storing the level of the varying voltage.

12. The method of claim 11, further comprising:
biasing the remaining portion of the select gate layer during an operation in the stacked three-dimensional memory structure using the level of the varying voltage.

13. The method of claim 11, wherein:
the measuring indicates a short circuit path is present in the oxide in the end trench based on a level of the current.

14. The method of claim 11, wherein:
the measuring indicates a short circuit path is present in the oxide in the end trench based on a rate of increase of the current.

15. A memory device, comprising:
a stacked three-dimensional memory structure comprising alternating conductive layers and dielectric layers, the conductive layers comprising a select gate layer, the select gate layer comprises parallel select gate lines and a remaining portion of the select gate layer, the remaining portion of the select gate layer extends transversely to the parallel select gate lines and is separated from the parallel select gate lines by an end trench at one end the of parallel select gate lines, the parallel select gate lines are separated from one another by side trenches, the end trench is connected to the side trenches, an oxide is provided in the side trenches and in the end trench; and
circuitry, the circuitry applies a voltage to the remaining portion of the select gate layer, detecting a short circuit path in the oxide in the end trench while the voltage is applied, determines a voltage level for counteracting the short circuit path, and biases the remaining portion of the select gate layer during an operation in the stacked three-dimensional memory structure using the voltage level for counteracting the short circuit path.

16. The memory device of claim 15, wherein:
the parallel select gate lines are connected to a ground via a switch;
the switch is provided in a conductive state while the voltage is applied; and
the switch is provided in a non-conductive state during the operation.

17. The memory device of claim 15, wherein:
the voltage applied to the remaining portion of the select gate layer varies;
the detecting the short circuit path comprises detecting a value of the voltage applied to the remaining portion of the select gate layer which results in an increase in a current through the remaining portion of the select gate layer above a threshold level; and the voltage level for counteracting the short circuit path is based on the value of the voltage applied to the remaining portion of the select gate layer which results in the increase in the current through the remaining portion of the select gate layer above the threshold level.

18. The memory device of claim 17, wherein:
the voltage level for counteracting the short circuit path is at least as high as the value of the voltage applied to the remaining portion of the select gate layer which results in the increase in the current through the remaining portion of the select gate layer above the threshold level.

19. The memory device of claim 15, wherein:
the voltage applied to the remaining portion of the select gate layer varies;
the detecting the short circuit path comprises detecting a value of the voltage applied to the remaining portion of the select gate layer which results in a rate of increase in a current through the remaining portion of the select gate layer above a threshold rate; and
the voltage level for counteracting the short circuit path is based on the value of the voltage applied to the remaining portion of the select gate layer which results in the rate of increase in the current through the remaining portion of the select gate layer above the threshold rate.

20. The memory device of claim 19, wherein:
the voltage level for counteracting the short circuit path is at least as high as the value of the voltage applied to the remaining portion of the select gate layer which results in the rate of increase in the current through the remaining portion of the select gate layer above the threshold rate.

* * * * *